United States Patent [19]

Otten

[11] Patent Number: 4,554,625
[45] Date of Patent: Nov. 19, 1985

[54] METHOD FOR GENERATING AN OPTIMIZED NESTED ARRANGEMENT OF CONSTRAINED RECTANGLES

[75] Inventor: Ralph H. J. M. Otten, Croton-on-Hudson, N.Y.

[73] Assignee: International Business Machines Corporation, Armonk, N.Y.

[21] Appl. No.: 504,206

[22] Filed: Jun. 14, 1983

[51] Int. Cl.⁴ ............................................. B26D 5/00
[52] U.S. Cl. .................................. 364/148; 364/475; 364/491
[58] Field of Search ................ 364/148, 475, 490, 491

[56] References Cited

U.S. PATENT DOCUMENTS 3,490,147 1/1970 Britchard et al. .............. 364/148 X
3,490,320 1/1970 Valembois et al. ............. 364/148 X

*Primary Examiner*—Jerry Smith
*Assistant Examiner*—Allen MacDonald
*Attorney, Agent, or Firm*—George E. Clark; Thomas P. Dowd

[57] ABSTRACT

The overall arrangement of a number of non-overlapping rectangles with constraints on their size and shape, may be generated with relation to a number of objective functions such as, size and shape of the enveloping rectangle, size of an interconnecting network, and distance between pairs of individual rectangles, by first embedding a distance space, reflecting the desired proximity structure, in the plane; next, by refining containment relations, fixing the relative positions of rectangles within such a containment in accordance with the corresponding positions in the embedding; and on the basis thereof estimating the space required for the local realization of the interconnecting network in a configuration satisfying the constraints on the individual rectangles, and optimal with respect to any quasi-concave objective function on the dimensions of the enveloping rectangle that is monotone in its arguments. The method can be implemented even on relatively small computers. Its major application is in the generation of mask patterns of complex semiconductor integrated circuits, especially when a given functional structure must be preserved by containment in rectangles.

24 Claims, 80 Drawing Figures

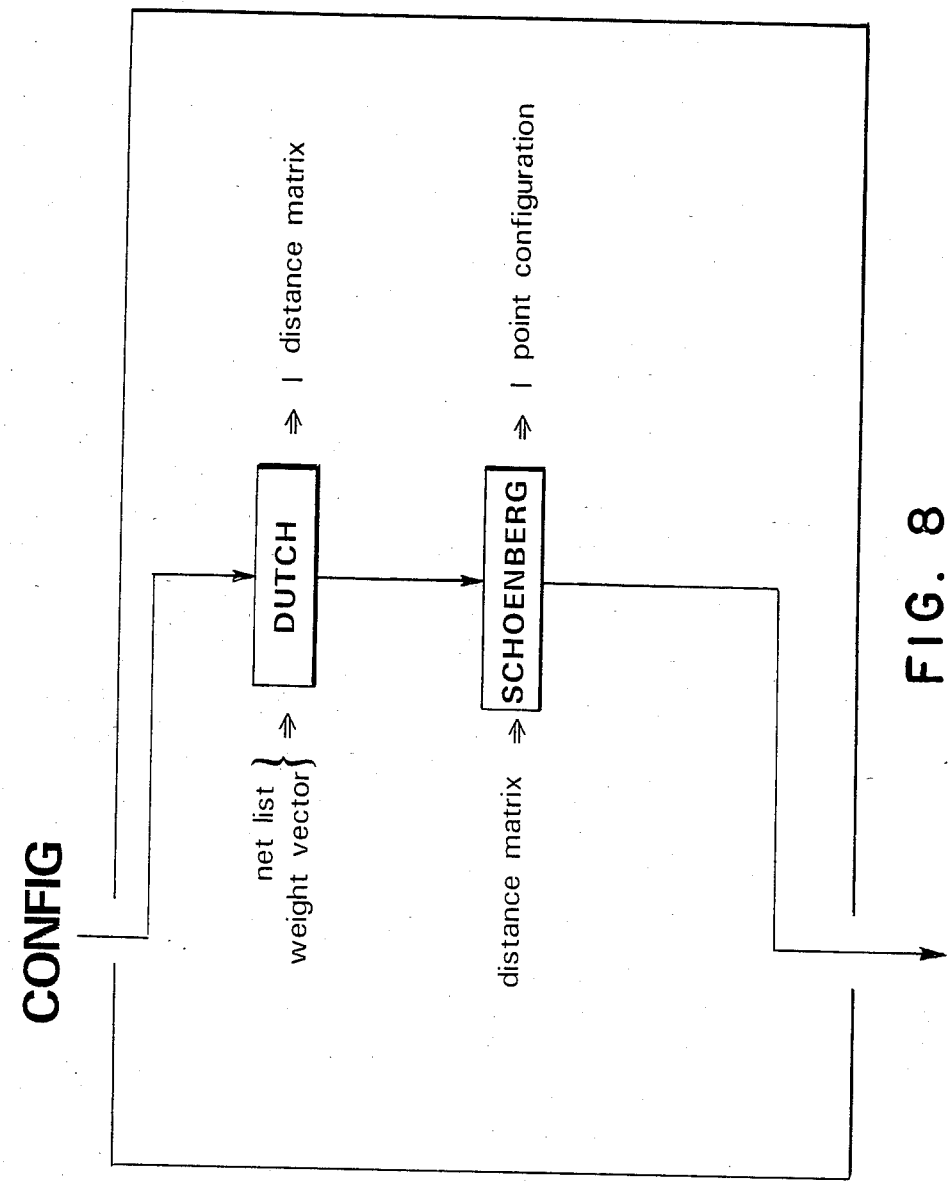

FIG. 9

```
∇DM←W DUTCH NL;N;M;TT;IW;TOP;F;BOT;J
[1]  A----Figure 9----
[2]  M←(ρNL)[1]
[3]  N←(ρNL)[2]
[4]  IW←((N,N)ρW)×TT←(N,N)ρ1,Nρ0
[5]  TOP←NL+.×IW+.×⍉NL
[6]  F←((M,N)ρ1)-NL
[7]  BOT←((+/W)×(J←(M,M)ρ1))-(F+.×IW+.×⍉F)
[8]  DM←J-(TOP÷BOT)
     ∇
```

FIG. 10a

```
∇EV←DIM SCHOENBERG DM;M;Z;M;S
[1]  A----Figure 10a---
[2]  M←(ρDM)[1]
[3]  Z←(M,M)ρ(1-↑M),Mρ-↑M
[4]  M←100
[5]  EV←(DIM,1E⁻6,1,2) SVI Z+.×(¯.5×DM)+.×Z
                         A→→→→Figure 10b
[6]  S←EV[1;]*0.5
[7]  →L1⌈⍳(EV[2;1]≥0)
[8]  S[1]←⁻1×S[1]
[9]  L1:→L2⌈⍳(EV[2;2]≥0)
[10] S[2]←⁻1×S[2]
[11] L2:EV←EV×((M+1),DIM)ρ(DIMρ1),(M×DIM)ρS
     ∇
```

FIG. 10b

```
∇R←KE SVI M;A;N;I;IT
[1]  A----Figure 10b----
[2]  R←KE[I←IT←1]×N←⌈/ρA←⍳'▨'[1+KE[3]=0],'M'
[3]  R←ORTH (N,KE[1])ρ0.001×⁻1000+?Rρ2000 A→→→→Figure 10c
[4]  →(KE[4]≤0)/L1
[5]  L0:A←A+.×A
[6]  →(KE[4]≥I←I+1)/L0
[7]  L1:R←ORTH A+.×N←R
[8]  →(M≥IT←IT+1)/B1
[9]  →B2
[10] B1:→(KE[2]<⌈/,(|N)-|R)/L1
[11] B2:R←(1 1 ⍉(⍉R)+.×M+.×R),[1] R
     ∇
```

FIG. 10c

```
    ∇ A←ORTH R;K;RK;J;WWW;XXX;YYY
[1] A----Figure 10c----
[2] WWW←R
[3] →B1,RK←(-K←1)+ρA←R
[4] L1:J←1
[5] L2:A[;K]←A[;K]-A[;J]×A[;J]+.×A[;K]
[6] →(K>J←J+1)/L2
[7] B1:A[;K]←A[;K]÷(A[;K]+.×A[;K])*0.5
[8] →(RK≥K←K+1)/L1
[9] YYY←A
    ∇
```

FIG. 11a

```
    ∇ SEQ←ANNEAL;DIM;CORR;CROSS;RANGE;M;N;T;SCORE;NWSC;
                I;POS;P1;P2;SEL
[1]  A----Figure 11a----
[2]  N←(ρNETL)[1]
[3]  M←(ρFLPL)[1]
[4]  DIM←FLPL[;11 12]
[5]  DIM[;1]←DIM[;1]÷+/DIM[;1]
[6]  DIM[;2]←DIM[;2]÷+/DIM[;2]
[7]  SEQ←((M,1)ριM),[2](M,1)ριM
[8]  CROSS←((M+1),2)ρ0
[9]  RANGE←(N,2,2)ρ0
[10] I←1
[11] NXTNET:P1←NETL[I;7]
[12] P2←NETL[I;8]
[13] POS←NTOMOD[(P1-1)+ι(1+P2-P1)]
[14] RANGE[I;;1]←⌊/POS
[15] RANGE[I;;2]←⌈/POS
[16] POS←RANGE[I;1;1]+ιRANGE[I;1;2]-RANGE[I;1;1]
[17] CROSS[POS;]←CROSS[POS;]+1
[18] →(N≥I←I+1)ρNXTNET
[19] NWSC←OBJECTF A→→→→Figure 11f
[20] INIT:SCORE←NWSC
[21] INTERCH SEL←(?2),(?M),?M A→→→→Figure 11b
[22] T←|SCORE-NWSC←OBJECTF
[23] →(T=0)ρINIT
[24] SCORE←NWSC
[25] HEAT A→→→→Figure 11c
[26] COOL A→→→→Figure 11d
    ∇
```

FIG. 11b

```
    ∇ INTERCH SL;AX;M1;M2;SQ;SQ1;SQ2
[1] A----Figure 11b----
[2] AX←SL[1]
[3] M1←SL[2]
[4] M2←SL[3]
[5] SQ1←SEQ[M1;AX]
[6] SQ2←SEQ[M1;AX]←SEQ[M2;AX]
[7] SEQ[M2;AX]←SQ1
[8] (SQ←((SQ1⌊SQ2),SQ1⌈SQ2)) ADJUSTFR M1
                A→→→→Figure 11e
[9] SQ ADJUSTFR M2
    ∇
```

FIG. 11c

```
     ∇ HEAT;NATT;NACC
[1]  A----Figure 11c----
[2]  NXTEMP:T←T×TMULT
[3]  NATT←0
[4]  NACC←0
[5]  NXATT:NATT←NATT+1
[6]  →(NATT>M)ρTST
[7]  INTERCH SEL←(?2),(?M),?M A→→→→Figure 11b
[8]  NWSC←OBJECTF A→→→→Figure 11f
[9]  →REJECTρNXATT
[10] SCORE←NWSC
[11] NACC←NACC+1
[12] →NXATT
[13] TST:→(NACC≤ACCRATE×M)ρNXTEMP
     ∇
```

FIG. 11d

```
∇COOL;NRFL;NRAC;NRAT
[1]  A----Figure 11d----
[2]  NRFL←0
[3]  T←T×TDIV
[4]  CORR←1+NRAT←NRAC←0
[5]  NXTMP:
[6]  NRAT←NRAC←0
[7]  T←T+TDIV
[8]  NXAT:NRAT←NRAT+1
[9]  INTERCH SEL←(?2),(?M),?M A→→→→Figure 11b
[10] NWSC←OBJECTF A→→→→Figure 11f
[11] →REJECTρTEST
[12] SCORE←NWSC
[13] NRAC←NRAC+1
[14] →(NRAC≥NR1×M)ρNXTMP
[15] TEST:→(NRAT<NR2×M)ρNXAT
[16] →(NRAC=0)ρ0
[17] NRFL←NRFL+1
[18] →(NRFL<NR3)ρNXTMP
     ∇
```

FIG. 11e

```
∇RM ADJUSTER MX;P1;P2;Q1;Q2;NT;R;L;H
[1]  A----Figure 11e----
[2]  P1←2+FLPL[MX;17]
[3]  P2←FLPL[MX;18]
[4]  →(P1=P2)ρ0
[5]  NXNT:NT←NETPOS[P1;1]
[6]  →((RANGE[NT;AX;1]<RM[1])∧RM[2]<RANGE[NT;AX;2])ρCHCK
[7]  R←RANGE[NT;AX;]
[8]  L←M+1
[9]  H←0
[10] Q1←NETL[NT;7]
[11] Q2←NETL[NT;8]
[12] NXMD:H←H⌈SEQ[NTOMOD[Q1];AX]
[13] L←L⌊SEQ[NTOMOD[Q1];AX]
[14] →(Q2≥Q1←Q1+1)ρNXMD
[15] RANGE[NT;AX;]←L,H
[16] ⍎(L<R[1])/'CROSS[L+ιR[1]-L;AX]
                 ←CROSS[L+ιR[1]-L;AX]+1'
[17] ⍎(R[1]<L)/'CROSS[R[1]+ιL-R[1];AX]
                 ←CROSS[R[1]+ιL-R[1];AX]-1'
[18] ⍎(R[2]<H)/'CROSS[R[2]+ιH-R[2];AX]
                 ←CROSS[R[2]+ιH-R[2];AX]+1'
[19] ⍎(H<R[2])/'CROSS[H+ιR[2]-H;AX]
                 ←CROSS[H+ιR[2]-H;AX]-1'
[20] CHCK:→(P2≥P1←P1+1)ρNXNT
     ∇
```

FIG. 11f

```
    ∇ S←OBJECTF;XINT;YINT;X;Y;SP
[1] ⍝----Figure 11f----
[2] X←(¯0.5++\DIM[SEQ[;1];1])[⍋SEQ[;1]]
[3] Y←(¯0.5++\DIM[SEQ[;2];2])[⍋SEQ[;2]]
[4] CORR←(+/X×Y)÷((+/X×X)×+/Y×Y)*0.5
[5] SP←0.5×(0,DIM[SEQ[;1];1])+DIM[SEQ[;1];1],0
[6] XINT←+/SP×CROSS[;1]
[7] SP←0.5×(0,DIM[SEQ[;2];2])+DIM[SEQ[;2];2],0
[8] YINT←+/SP×CROSS[;2]
[9] S←(1+W×|CORR)×XINT+YINT-PLAT
    ∇
```

FIG. 11g

```
    ∇ B←REJECT;EXP
[1] ⍝----Figure 11g----
[2] EXP←(NWSC-SCORE)÷T
[3] →(~B←~EXP<0)⍴0
[4] →(~B←(?10000)>10000×*-EXP)⍴0
[5] INTERCH SEL ⍝→→→→Figure 11b
    ∇
```

```
∇TREE←LOCUS SLICING AREA;OLDPOS;NEWPOS;
              BASIS;LEV;SQAR;INDEX;MARK;OB;DIM;LEAF
[1]  A----Figure 13a----
[2]  TREE←((¯1+2×N)ρ 1 0)\ιN
[3]  SQAR←0.5×AREA*0.5
[4]  DIM←(2,N)ρ((SQAR×INSET),SQAR×÷INSET)
[5]  MARK←ι0
[6]  LEAF←ι0
[7]  INITY←,Y
[8]  INITX←,X
[9]  INDEX←0
[10] LEV←1
[11] OLDPOS←0
[12] NEXT:NEWPOS←OLDPOS+⌊/((OLDPOS↓TREE)ι(-(ιLEV)))
[13] BASIS←,(NEWPOS-OLDPOS+1)↑(OLDPOS↓TREE)
[14] OB←0
[15] →SN×ι(1≠ρBASIS)
[16] →NS×ι((LEAFιBASIS[1])≤ρLEAF)
[17] LEAF←LEAF,BASIS[1]
[18] →SN
[19] NS:INDEX←INDEX-1
[20] SN:INDEX←INDEX+1
[21] TREE[OLDPOS+ι(NEWPOS-OLDPOS+1)]←BASIS SLICE LEV+1
                   A→→→→Figure 13b
[22] OLDPOS←NEWPOS
[23] →NEXT×ι(OLDPOS≤¯1+2×N)
[24] LEV←LEV+1
[25] OLDPOS←0
[26] →NEXT×ι((TREEι0)≤¯1+2×N)
     ∇
```

FIG. 13b

```
∇SUBTREE←BASIS SLICE LEVEL;COOR;V;L;BASAR;DIR
[1]  A----Figure 13b----
[2]  DIR←1+2|(LEVEL+DIR1)
[3]  COOR←LOCUS[DIR;]
[4]  L←ι0
[5]  V←(BASIS>0)/BASIS
[6]  V←V[▲COOR[V]]
[7]  BASAR←+/AREA[V]
[8]  →NONE×ι(1=ρV)
[9]  L←V SELECT DIM[DIR;] A→→→→Figure 13c
[10] L UPDATE V A→→→→Figure 13d
[11] NONE:SUBTREE←((¯1+2×ρV)ρ 1 0)\V
[12] SUBTREE[2×L]←-LEVEL
     ∇
```

FIG. 13c

```
∇ L←V SELECT SQAR;M;BLOW;START;SHRINK;GR;GREQ;GRCOS
[1]  ⍝----Figure 13c----
[2]  M←ρV
[3]  BLOW←((COOR[V[M]]-COOR[V[1]])÷(L/SQAR[V]))
[4]  START←BLOW×SQAR
[5]  SHRINK←(M-1)ρ0
[6]  V DETSHR COOR  ⍝→→→→Figure 13e
[7]  GR←DEFPREV SHRINK  ⍝→→→→Figure 13f
[8]  L←(SHRINK≥GR)/⍳(M-1)
   ∇
```

FIG. 13d

```
∇ LIN UPDATE SERIE;TL;NRCH;D;I
[1]  ⍝----Figure 13d----
[2]  NRCH←1+ρLIN
[3]  TL←0,LIN,ρSERIE
[4]  D←INITX[INDEX]
[5]  INITY←INITY,NRCHρD
[6]  D←INITY[INDEX]
[7]  I←2
[8]  NXTCH:INITX←INITX,
            D×(+/AREA[TL[I-1]+TL[I]↓SERIE])÷BASAR
[9]  →NXTCH×⍳((NRCH+1)≥I←I+1)
   ∇
```

FIG. 13e

```
∇ SV DETSHR SCOOR;PNTR;SHR;BINS;FINS;
                  BOPT;FOPT;BLAP;FLAP;BINX;FINX
[1]  ⍝----Figure 13e----
[2]  PNTR←1
[3]  NXTPOS:BINS←SV[PNTR+⍳(M-PNTR)]
[4]  FINS←SV[⍳PNTR]
[5]  SHR←1
[6]  LAP:BLAP←SCOOR[BINS]-SHR×START[BINS]
[7]  FLAP←SCOOR[FINS]+SHR×START[FINS]
[8]  BOPT←⌊/BLAP
[9]  FOPT←⌈/FLAP
[10] →SOND×⍳(BOPT≥FOPT)
[11] BINX←BINS[BLAP⍳BOPT]
[12] FINX←FINS[FLAP⍳FOPT]
[13] SHR←((SCOOR[BINX]-SCOOR[FINX])
               ÷(START[BINX]+START[FINX]))
[14] →LAP
[15] SOND:SHRINK[PNTR]←SHR
[16] →NXTPOS×⍳(M>PNTR←PNTR+1)
   ∇
```

FIG. 13f

```
    ∇ GRENS←DEFPREV SCHRINK;SINR;P;TRIAL;DEFORM;TRYTREE;I
[1] A----Figure 13f----
[2] SINR←SCHRINK[⍋SCHRINK]
[3] P←1
[4] →MRK×ι(SINR[1]=0)
[5] NXTTR:TRIAL←(SCHRINK≥SINR[P])/ι(M-1)
[6] DEFORM←V CALCDEF TRIAL A→→→→Figure 13g
[7] →NXTTR×ι((M>P←P+1)∧DEFORM≤0)
[8] P←P-(2×(DEFORM>0))+(P≥M)×DEFORM≤0
[9] →P1×ι(P=0)
[10] GRENS←SINR[P]
[11] →0
[12] P1:I←ρMARK
[13] OB←0
[14] →PM×ι(I<2)
[15] PRPR:OB←∧/MARK[((I-1),I)]=(OLDPOS,NEWPOS)
[16] →ACC×ιOB
[17] →PRPR×ι((~OB)∧(0≠I←I-2))
[18] PM:→MRK×ι(V ACCAN DEFORM) A→→→→Figure 13h
[19] ACC:GRENS←SINR[1]
[20] →0
[21] MRK:MARK←MARK,OLDPOS,NEWPOS
[22] GRENS←1
    ∇
```

FIG. 13g

```
    ∇ DEFORMATION←SLMODS CALCDEF TRI;T;A;B;W;DFM;CTYPE;L;H
[1] A----Figure 13g----
[2] T←1+ρTRI
[3] TRI←TRI,M
[4] B←0
[5] I←1
[6] DEFORMATION←0
[7] NXTCHILD:DFM←0
[8] W←B+TRI[I]↓SLMODS
[9] A←+/AREA[W]
[10] L←A×((INITY[INDEX]×(OB=0))
                  +(INITX[INDEX]×(OB≠0)))÷BASAR
[11] H←A+L
[12] CTYPE←W∊((INSET≠1)/ιN)
[13] DFM←DFM+(CTYPE/W) INSETDEF (L,H) A→→→→Figure 13i
[14] DFM←DFM+((~CTYPE)/W) FLEXDEF (L,H) A→→→→Figure 13j
[15] DEFORMATION←DEFORMATION+DFM÷ρW
[16] B←TRI[I]
[17] →NXTCHILD×ι(T≥I←I+1)
    ∇
```

FIG. 13h

```
∇ DNA←SETV ACCAN VERVORM;
                  DRCT;ORV;ENL;START;SHRINK
[1] ⍝(⍝g----Figure 13h----)⍝g
[2] DRCT←3-DIR
[3] OB←1
[4] ORV←SETV[⍋LOCUS[DRCT;SETV]]
[5] ENL←(LOCUS[DRCT;ORV[M]]-LOCUS[DRCT;ORV[1]])
              ÷(⌊/DIM[DRCT;ORV])
[6] START←BLOW×DIM[DRCT;]
[7] SHRINK←(M-1)⍴0
[8] ORV DETSHR LOCUS[DRCT;] ⍝→→→→Figure 13e
[9] DNA←VERVORM>(ORV CALCDEF(,SHRINK⍳(⌈/SHRINK)))
                ⍝→→→→Figure 13g
∇
```

FIG. 13i

```
∇ DFMINSET←MSETF INSETDEF SIDES
  ⍝----Figure 13i----
[1] DFMINSET←0
∇
```

FIG. 13j

```
∇ DFMFLEX←MSET FLEXDEF SIDES;A;B;DEFMOD;TERM
[1] ⍝----Figure 13j----
[2] DFMFLEX←0
[3] A←⌊/SIDES
[4] →0×⍳(A=0)
[5] B←⌈/SIDES
[6] TERM←A÷AREA[MSET]*0.5
[7] DEFMOD←TERM<1
[8] →0×⍳(0=+/DEFMOD)
[9] DFMFLEX←+/DEFMOD/(¯2+TERM+÷TERM)
[10] DFMFLEX←DFMFLEX+
      ((~DEFMOD)/MSET) FLEXDEF ((B-(+/AREA[MSET])÷A),A)
∇
```

FIG. 13k

```
∇ DSTR←LINK SHTREE;GEN;LPAR;RPAR;
                  FATHER;FATHPL;CHILD;PRIMO;PNT;TSV
[1]   A----Figure 13k----
[2]   DSTR←1 0 0 0 1 0 0 0
[3]   GEN←2
[4]   NXTGEN:RPAR←0
[5]   FATHER←10000×GEN-1
[6]   CHILD←10000×GEN
[7]   NXTFAM:FATHER←FATHER+1
[8]   PRIMO←1
[9]   FATHPL←(((ρDSTR)ρ1 0 0 0)/DSTR)ιFATHER
[10]  FATHPL←¯3+4×FATHPL
[11]  RPAR←RPAR+L/(RPAR↓SHTREE)ι(-(ιGEN-1))
[12]  LPAR←RPAR-L/(⌽((RPAR-1)↑SHTREE))ι(-(ιGEN-1))
[13]  PNT←LPAR
[14]  →NXTCH×ι(2≠RPAR-LPAR)
[15]  FATHER←FATHER-(SHTREE[LPAR+1]=0)
[16]  →SKIP×ι(SHTREE[LPAR+1]=0)
[17]  DSTR[FATHPL]←SHTREE[LPAR+1]
[18]  TSV←DSTR[FATHPL-1]
[19]  DSTR[FATHPL-1]←((TSV≠FATHER)×TSV)
                    +(TSV=FATHER)×SHTREE[LPAR+1]
[20]  TSV←DSTRιFATHER
[21]  SHTREE[LPAR+1]←SHTREE[LPAR+1]×(TSV≤ρDSTR)
[22]  →SKIP×ι(TSV>ρDSTR)
[23]  DSTR[TSV]←SHTREE[LPAR+1]
[24]  SHTREE[LPAR+1]←0
[25]  →SKIP
[26]  NXTCH:CHILD←CHILD+1
[27]  DSTR[FATHPL+2]←DSTR[FATHPL+2]+PRIMO×CHILD
[28]  PRIMO←0
[29]  PNT←PNT+(PNT↓SHTREE)ι(-GEN)
[30]  DSTR←DSTR,CHILD,FATHER,0,(CHILD+1)×PNT<RPAR
[31]  →NXTCH×ι(PNT<RPAR)
[32]  SKIP:→NXTFAM×ι(RPAR≠1+ρSHTREE)
[33]  →NXTGEN×ι(((-(L/SHTREE))+1)≥GEN←GEN+1)
[34]  DSTR←(((ρDSTR)÷4),4)ρDSTR
[35]  NRSL←(ρDSTR)[1]
[36]  DSTR←⍉(8,NRSL)ρ(,⍉DSTR),(4×NRSL)ρ(((2×(ρINITX))ρ0),
                    INITX,INITY)
[37]  DSTR←DSTR[⍋DSTR[;1];]
[38]  TSV←1
[39]  NXTRW:PNT←2
[40]  NXTCOL:DSTR[TSV;PNT]←(DSTR[TSV;PNT]≠0)
                    ×DSTR[;1]ιDSTR[TSV;PNT]
[41]  →NXTCOL×ι(4≥PNT←PNT+1)
[42]  →NXTRW×ι(NRSL≥TSV←TSV+1)
[43]  DSTR←⌽⍉((7,NRSL)ρ((7×NRSL)ρ(,⍉⌽DSTR)))
[44]  DSTR←⍉(8,NRSL)ρ(ιNRSL),,⍉DSTR
    ∇
```

FIG. 14

```
∇ SHBOOM←ADJC DATS;BIAS;NGEN;GEN;LV;
                    NXTGEN;I;NMRJC;SON;FATH;JCDATS;ITY
[1]  A----Figure 14----
[2]  NGEN←1
[3]  GEN←,DATS[;2]⍳0
[4]  BIAS←(⍴DATS)[1]
[5]  LV←2
[6]  NMRJC←0
[7]  JCDATS←⍳0
[8]  VOLGESL:I←1
[9]  NXTGEN←⍳0
[10] NXTFAT:FATH←GEN[I]
[11] →LASTSON×⍳(DATS[FATH;3]=0)
[12] SON←DATS[FATH;3]
[13] NXTGEN←NXTGEN,SON
[14] NXTSIB:→LASTSON×⍳(DATS[SON;4]=0)
[15] NMRJC←NMRJC+1
[16] ITY←¯1×(1+2|LV+1)
[17] JCDATS←JCDATS,(NMRJC+BIAS),FATH,0,DATS[SON;4],
                 ITY,(-LV),0,DATS[FATH;7]
[18] DATS[FATH;5 6]←¯3,(LV-1)
[19] DATS[SON;4]←NMRJC+BIAS
[20] SON←JCDATS[¯4+8×NMRJC]
[21] NXTGEN←NXTGEN,SON
[22] →NXTSIB
[23] LASTSON:→NXTFAT×⍳(NGEN≥I←I+1)
[24] NGEN←⍴NXTGEN
[25] GEN←NXTGEN
[26] LV←LV+1
[27] →VOLGESL×⍳(NGEN≠0)
[28] SHBOOM←((BIAS+NMRJC),8)⍴((,DATS),JCDATS)
[29] NRSL←NRSL+NMRJC
[30] I←¯1+SHBOOM[;2]⍳0
[31] SHBOOM[⍳I;6]←1+SHBOOM[SHBOOM[⍳I;2];6]
   ∇
```

FIG. 15b

| | | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| FRAME | JUNCTION CELLS | COMPOUNDS | | | | MODULES | | | | | | | | | | | | | |
| | | slice number | parent | primogenitive | next sibling | type | orient./le | topjc | botjc | leftjc | rightjc | longitudinal dim | latitudinal dim | x coordinate | y coordinate | breakpt pointer1 | breakpt pointer2 | pin pointer1 | pin pointer2 |
| | | tree information | | | | | orientation | surrounding junction cells | | | | slice dimensions | | lowest coordinates of slice rectangle | | BREAKPTS - pointer1 | BREAKPTS - pointer2 | NETPOS - pointer1 | NETPOS - pointer2 |
| | tributary to | | | | | | | | | | | | | | | | | | |
| | INJC - pointer1 | | | | | | | | | | | | | | | | | | |
| | INJC - pointer2 | | | | | | | | | | | | | | | | | | |

FIG. 16a
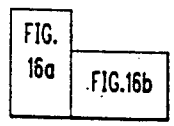
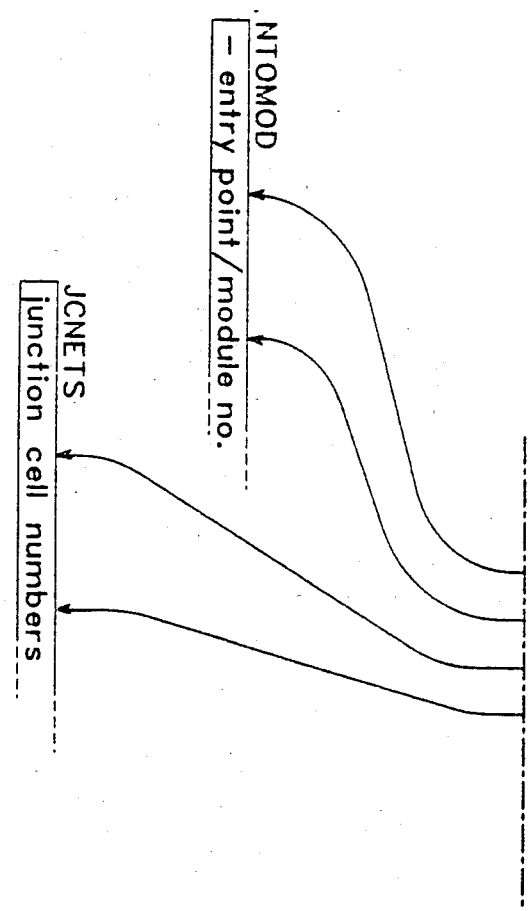

FIG. 16b

| | | NET INFORMATION | | | | | | | |
|---|---|---|---|---|---|---|---|---|---|
| 1 | net number | | | | | | | | |
| 2 | type | | | | | | | | |
| 3 | weight | | | | | | | | |
| 4 | max | | | | | | | | |
| 5 | size | net size or length | | | | | | | |
| 6 | slice | minimum size for which net is local | | | | | | | |
| 7 | module pointer1 | NTOMOD – pointer1 | | | | | | | |
| 8 | module pointer2 | NTOMOD – pointer2 | | | | | | | |
| 9 | ic pointer1 | JCNETS – pointer1 | | | | | | | |
| 10 | ic pointer2 | JCNETS – pointer2 | | | | | | | |

LOCAL : GLOBAL

FIG. 18a

```
∇ INCIDE;VRK;VRC;HRK;HRC;DS;NXTSIB;N;Q;SLC;B;CT
[1]   ⍝----Figure 18a----
[2]   CT←0
[3]   DS←(¯1) DFSMJI FLPL[;2]⍳0.⍝→→→→Figure 18b
[4]   →(~FRAME)⍴0
[5]   MJI 'R' ⍝→→→→Figure 18c
[6]   N←(⍴FLPL)[1]
[7]   B←~Q←SLC←0
[8]   (N+1) EDGES VRC ⍝→→→→Figure 18d
[9]   Q←1
[10]  (N+2) EDGES VRK
[11]  Q←1+B←¯1
[12]  (N+3) EDGES (N+5 1),HRC,N+2 6
[13]  Q←1
[14]  (N+4) EDGES (N+5 1),HRK,N+2 6
      ∇
```

FIG. 18b

```
∇ PSS←B DFSMJI SLC;P;CH;DH;DS;VSC;VSK;
                  HSC;HSK;VTC;VTK;HTC;HTK;Q
[1]   ⍝----Figure 18b----
[2]   P←FLPL[SLC;3]
[3]   ⍎(P=0)/'HSC←-VSC←-VSK←-HSK←,B×SLC'
[4]   →(P=0)⍴RETURN
[5]   DS←(-B) DFSMJI P
[6]   MJI 'S' ⍝→→→→Figure 18c
[7]   →(NXTSIB=0)⍴RETURN
[8]   CH←((B=1),B=¯1)/'VH'
[9]   DH←((B=1),B=¯1)/'HV'
[10]  Q←0
[11]  NXTCH:DS←(-B) DFSMJI NXTSIB
[12]  MJI 'T'
[13]  →Q⍴NOTJC
[14]  Q←1
[15]  (|⍎CH,'TC[1]') EDGES ⍎CH,'SK' ⍝→→→→Figure 18d
[16]  →UPD
[17]  NOTJC:Q←0
[18]  (|⍎CH,'SK[1]') EDGES ⍎CH,'TC'
[19]  UPD:⍎CH,'SK←',CH,'TK'
[20]  ⍎DH,'SC←',DH,'SC,',DH,'TC'
[21]  ⍎DH,'SK←',DH,'SK,',DH,'TK'
[22]  →(NXTSIB≠0)⍴NXTCH
[23]  RETURN:PSS←((((,0) PACK VSC) PACK VSK)
                  PACK HSC) PACK HSK) PACK ,FLPL[SLC;4]
      ∇
```

FIG. 18c

```
∇ MJI C;POS;NRSH
[1]  A----Figure 18c----
[2]  POS←2
[3]  NRSH←5
[4]  ▲ 'V',C,'C←,UNPACK ''S'''
[5]  ▲ 'V',C,'K←,UNPACK ''S'''
[6]  ▲ 'H',C,'C←,UNPACK ''S'''
[7]  ▲ 'H',C,'K←,UNPACK ''S'''
[8]  NXTSIB←UNPACK 'S'
∇
```

FIG. 18d

```
∇ JC EDGES V;A;S;I;N
[1]  A----Figure 18d----
[2]  A←0
[3]  I←1
[4]  N←ρV
[5]  DO:S←V[I]
[6]  ▲ ((ρFLPL)[1]≥|S)/
     'FLPL[(|S);((9-Q)×S<0)+(7+3×Q)×S>0]←JC'
[7]  ▲ (~A)/'ANCEST S' A→→→→Figure 18e
[8]  →(~A∧B=1)ρMIN1
[9]  →(TJUNC[IX[JC];IX[|S]]≠0)ρNTR
[10] TJUNC[IX[JC];IX[|S]]←CT←CT+1
[11] MIN1:→(~A∧B=¯1)ρNTR
[12] →(TJUNC[IX[|S];IX[JC]]≠0)ρNTR
[13] TJUNC[IX[|S];IX[JC]]←CT←CT+1
[14] NTR:A←~A
[15] →(N≥I←I+1)ρDO
∇
```

FIG. 18f

```
∇ GLOBAL;COMMANC
[1]  A----Figure 18f----
[2]  V←FLPL[((FLPL[;5]=¯2)/⍳NRSL);113]
[3]  H←FLPL[((FLPL[;5]=¯1)/⍳NRSL);114]
[4]  →(FRAME=0)ρNOFRAME
[5]  COMMANC←FLPL[;2]⍳0
[6]  H←H,[1] 2 2 ρ (NRSL+1),0,(NRSL+2),FLPL[COMMANC;12]
[7]  V←V,[1] 2 2 ρ (NRSL+3),0,(NRSL+4),FLPL[COMMANC;11]
[8]  NOFRAME:V←V,[2]((ρH),1)ρ0
[9]  H←H,[2]((ρV),1)ρ0
[10] VC△VL[;2;3]←¯1↑(ρV)[1]
[11] HL△HL[;2];3]←¯1+(ρH)[1]-⍳(ρH)[1]
[12] IX←(NRSL+FRAME×4)ρ0
[13] IX[VL[;1]]←VL[;3]
[14] IX[HL[;1]]←HL[;3]
[15] TJUNC←((ρH)[1],(ρV)[1])ρ0
∇
```

FIG. 18e

```
∇ ANCEST S;SGNS
[1]  A----Figure 18e----
[2]  SGNS←(S<0),S>0
[3]  S←|S
[4]  →CHECK
[5]  ACT:SGNS←~SGNS
[6]  FLPL[S;+/((9-Q),7+3×Q)×SGNS]←JC
[7]  CHECK:→((ρFLPL)[1]<S)ρ0
[8]  →(SLC≠S←FLPL[S;2])ρACT
∇
```

```
     ∇ PDATA←DSTR PACK STR
[1] A----Figure 20a----
[2] PDATA←DSTR,(ρρSTR),(ρSTR),,STR
[3] PDATA[1]←PDATA[1]+1
     ∇
```

FIG. 20b

```
     ∇ STR←UNPACK NAME;RHO;JMP;X;RRHO
[1] A----Figure 20b----
[2] STR←RHOρ(JMP←×/RHO
         ←(⍕X)[POS+⍳RRHO])↑(POS+RRHO←(⍕X)[POS])↓⍕X←'D',NAM
[3] POS←POS+1+RRHO+JMP
[4] NRSH←NRSH-1
     ∇
```

FIG. 22

```
     ∇ P←SHORTEST D;L;N;S;T
[1] A----Figure 22----
[2] N←(ρD)[1]
[3] P←(N,N)ρ⍳N
[4] L←1
[5] NXTL:T←D>S←D[;L]∘.+D[L;]
[6] D←D⌊S
[7] P←(P×~T)+T×⍉(N,N)ρP[;L]
[8] →(N≥L←L+1)ρNXTL
[9] P←((N,N,1)ρ,D),[3](N,N,1)ρ,P
     ∇
```

FIG. 23a

```
∇ S←ANCSLICE NT;COUNT;MSET;B;NIL;NRPIN
[1] A----Figure 23a----
[2] NRPIN←COUNT←1+NETL[NT;8]-B←NETL[NT;7]
[3] MSET←NTOMOD[¯1+B+ɩCOUNT]
[4] NIL←DFSGEN FLPL[;2]ɩ0 A→→→→Figure 23h
    ∇
```

FIG. 23b

```
∇ SP←DTARG GREEDY D;POS;NRSH;
                I;N;J;W;IN;V;M;MM;JOTAN
[1]  A----Figure 23b----
[2]  N←(ρD)[1]
[3]  IN←Nρ0
[4]  POS←2
[5]  NRSH←DTARG[1]
[6]  I←1
[7]  NXTSET:V←UNPACK 'TARG'
[8]  →(IN[V]≠0)ρINS
[9]  IN[V]←I
[10] →NXS
[11] INS:IN←IN×IN≠W←IN[J←V[(IN[V]≠0)ɩ1]]
[12] IN[J]←W
[13] I←I-1
[14] NXS:I←I+1
[15] →(0<NRSH)ρNXTSET
[16] SP←0
[17] →(I≤2)ρ0
[18] V←(IN=1)/JOTAN←ɩN
[19] M←⌊/MM←⌊/D[V;(IN>1)/JOTAN]
[20] IN[V[MMɩM]]←¯1
[21] IN←IN×IN≠1
[22] →CHRDY
[23] NXEDGE:M←⌊/MM←⌊/D[V←(IN>0)/JOTAN;(IN<0)/JOTAN]
[24] W←IN[J←V[MMɩM]]
[25] IN[J]←-W
[26] IN←IN×IN≠W
[27] SP←SP+M
[28] CHRDY:→(∨/IN>0)ρNXEDGE
     ∇
```

FIG. 23c

```
∇ STR←DTSET STEINER SLSET;TPATH;CHSET;
                IS;SL1;DTSET1;SLR;DTSR;I;D1;NRIS
[1]  A----Figure 23c----
[2]  →(DTSET[1]>2)ρTREE
[3]  TPATH←DP[;;1] PATH DTSET A→→→→Figure 23d
[4]  STR←DP FILLP TPATH[2 3] A→→→→Figure 23e
[5]  →0
[6]  TREE:→(ρSLSET>2)ρSPLIT
[7]  CHSET←DTSET SELCH SLSET
[8]  STR←DTSET STEINER CHSET
[9]  →0
[10] SPLIT:PARTITE
[11] I←1
[12] CO←SP
[13] NRIS←ρIS
[14] NXTIS:D1←LONGEST A→→→→Figure 23g
[15] →(D1≥CO)ρNXINT
[16] TRY←(DTSET1 PACK ,IS[I]) STEINER SL1
[17] →(CO>+/TRY[;3])ρREST
[18] →NXINT
[19] REST:DTSR←DTSR PACKIS INTRSECT ,STR[;1 2]
                A→→→→Figure 23f
[20] TRY←TRY,[1]DTSR STEINER SLR
[21] ▼(CO>+/TRY[;3])/'STR←TRY'
[22] CO←+/STR[;3]
[23] NXINT:→(NRIS≥I←I+1)ρNXTIS
   ∇
```

FIG. 23d

```
∇ PTH←D PATH D2SET;V;W;M
[1] A----Figure 23d----
[2] NRSH←POS←2
[3] V←UNPACK '2SET'
[4] W←UNPACK '2SET'
[5] M←L/L/D[V;W]
[6] I←V[(L/D[V;W])ιM]
[7] J←W[(L/,D[I;W])ιM]
[8] PTH←D[I;J],I,J
   ∇
```

FIG. 23e

```
∇ ARR←P FILLP BE;I
[1] A----Figure 23e----
[2] ARR←0 3ρ0
[3] I←BE[1]
[4] NXEDG:ARR←ARR,[1](I,,P[I;BE[2];1 2])
[5] I←¯1↑ARR[;2]
[6] →(I≠BE[2])ρNXEDG
   ∇
```

FIG. 23f

```
∇ U←A INTRSECT B;I;J;K;C
[1] A----Figure 23f----
[2] C←(1↑(ρC)⊤-1-(,C)/⍳ρ,C←A∘.=B)[1;]
[3] U←A[((C⍳C)=⍳ρC)/C←,C]
  ∇
```

FIG. 23g

```
∇ D←LONGEST;NRSH;POS
[1] A----Figure 23g----
[2] D←0
[3] NRSH←DTSET1[1]
[4] POS←2
[5] NXTS1:D←D⌈(DP[;;1] PATH (1,1,1,IS[I])
              PACK UNPACK 'TSET1')[1]
[6] →(NRSH>0)ρNXTS1
[7] NRSH←DTSR[1]
[8] POS←2
[9] NXTS2:D←D⌈(DP[;;1] PATH (1,1,1,IS[I])
              PACK UNPACK 'TSR')[1]
[10] →(NRSH>0)ρNXTS2
  ∇
```

FIG. 23h

```
∇ NXSIB←DFSGEN SL;P;NXC;MYCNT
[1] A----Figure 23h----
[2] MYCNT←COUNT
[3] NXSIB←FLPL[SL;4]
[4] →(0≠P←FLPL[SL;3])ρNLV
[5] COUNT←COUNT-SL∊MSET
[6] →CHECK
[7] NLV:NXC←DFSGEN P
[8] NXCHILD:→(NXC=0)ρCHECK
[9] NXC←DFSGEN NXC
[10] →NXCHILD
[11] CHECK:⍎((COUNT=0)∧MYCNT=NRPIN)/'COUNT←S←SL'
  ∇
```

FIG. 26a

```
     ∇ RGEOM←CGEOM GEOM DGEOM;
                    PNTRS;BRPTS;INDS;NXBRP;B;ANC;DMS;P
[1]  A----Figure 26a----
[2]  NRSH←DGEOM[1]
[3]  POS←2
[4]  PNTRS←(NRSL,2)ρ0
[5]  INDS←UNPACK 'GEOM'
[6]  PNTRS[INDS[;1];]←INDS[;2 3]
[7]  BRPTS←(UNPACK 'GEOM'),[1]((3×DEPTH×NRLVS),2)ρ0
[8]  NXBRP←1+⌈/PNTRS[;2]
[9]  →(NRSH≠0)/'⎕←''DGEOM ONLY PARTIALLY UNPACKED'''
[10] →(0≠DFSFUN ANC←FLPL[(FLPL[;2]ι0);1])/'⎕←''ERROR'''
                    A→→→→Figure 26b
[11] P←(1,ASPECTR,ASPECTR,ASPECTR)[CGEOM]
[12] ⍎'DMS←P OPTIM',(⍕CGEOM),
            ' BRPTS[(⁻1+B+ι1+PNTRS[ANC;2]-
            B←PNTRS[ANC;1]);]'
                    A→→→→Figure 26c-f
[13] →(0≠(DMS[1],0) DFSDIM ANC)/'⎕←''ERROR'''
                    A→→→→Figure 26g
[14] RGEOM←((,0) PACK PNTRS)
            PACK BRPTS[ι(NXBRP-1);]
     ∇
```

FIG. 26b

```
     ∇ NXSIB←DFSFUN SLC;NXC;P
[1]  A----Figure 26b----
[2]  NXSIB←FLPL[SLC;4]
[3]  →(0=P←FLPL[SLC;3])/'→0'
[4]  NXC←DFSFUN P
[5]  NXCHILD:→(NXC=0)/'→SCALC'
[6]  NXC←DFSFUN NXC
[7]  →NXCHILD
[8]  SCALC:DETSFUN SLC  A→→→→Figure 26h
     ∇
```

FIG. 26c

```
     ∇ XY←SPEC OPTIM1 ANCSFUN;TA
[1]  A----Figure 26c----
[2]  XY←ANCSFUN[(TAιL/TA←×/[2]ANCSFUN);]
     ∇
```

FIG. 26d

```
  ∇ XY←AR OPTIM2 SF;L2;L1;X;DEN
[1] A----Figure 26d----
[2] L1←¯1+L2←(SF[;2]>SF[;1]×AR)ι0
[3] DEN←(SF[L2;2]+AR×SF[L1;1])-(SF[L1;2]+AR×SF[L2;1])
[4] XY←X,AR×X←((SF[L1;1]×SF[L2;2])-SF[L2;1]×SF[L1;2])÷DEN
  ∇
```

FIG. 26e

```
  ∇ XY←A OPTIM3 SF;YX
[1] A----Figure 26e----
[2] YX←(÷A) OPTIM2 SF A→→→→Figure 26d
[3] XY←A OPTIM2 SF
[4] ⍎((×/YX)<×/XY)/'XY←YX'
  ∇
```

FIG. 26f

```
  ∇ XY←A OPTIM4 SF;R;S;YX
[1] A----Figure 26f----
[2] XY←A OPTIM2 SF A→→→→Figure 26d
[3] R←SF[;1]≥XY[1]
[4] YX←(÷A) OPTIM2 SF
[5] S←SF[;1]≥YX[1]
[6] XY←1 OPTIM1 ((((R∧~S)∨S∧~R)/[1]SF),[1]XY),[1]YX. in 20
A→→→→Figure 26c
```

FIG. 26g

```
∇ NXSIB←XSLACK DFSDIM SLC;NXC;P;Y;B;
                PTSB;SQZE;ONLYCH;S;X;SLACK
[1]  A----Figure 26g----
[2]  X←XSLACK[1]
[3]  SLACK←XSLACK[2]
[4]  NXSIB←FLPL[SLC;4]
[5]  Y←|(PTSB←BRPTS[⁻1+B+
           ι(1+PNTRS[SLC;2]-B←PNTRS[SLC;1]);1 2]) MAPAT ,X
                  A→→→→Figure 26j
[6]  ±(PTSB[1;1]=X)/'Y←Y+SLACK'
[7]  SQZE←(0=P←FLPL[SLC;3])∧FLPL[SLC;6]≥0
[8]  S←X-|(⊖PTSB[;2 1]) MAPAT Y
[9]  FLPL[SLC;11 12]←(((~SQZE),SQZE)/(X,X-S)),Y
[10] →(SLC=ANC)ρSKP
[11] ONLYCH←(SLC=FLPL[FLPL[SLC;2];3])∧0=FLPL[SLC;4]
[12] ±(ONLYCH)/'FLPL[SLC;11 12]←FLPL[FLPL[SLC;2];12 11]'
[13] SKP:±(0=P)/'→0'
[14] NXC←(Y,S) DFSDIM P
[15] NXCHILD:±(0=NXC)/'→0'
[16] NXC←(Y,S) DFSDIM NXC
[17] →NXCHILD
    ∇
```

FIG. 26h

```
∇ DETSFUN S;C;NR;BP;X;BS
[1]  A----Figure 26h----
[2]  PNTRS[S;1]←NXBRP
[3]  C←FLPL[S;3]
[4]  BP←BRPTS[(NR-1)+ι(1+PNTRS[C;2]-NR←PNTRS[C;1]);]
[5]  NXSBL:→(0=C←FLPL[C;4])ρSTORE
[6]  BS←BRPTS[(NR-1)+ι(1+PNTRS[C;2]-NR←PNTRS[C;1]);]
[7]  BP←BS SSUM BP  A→→→→Figure 26i
[8]  →NXSBL
[9]  STORE:PNTRS[S;2]←⁻1+NXBRP←NXBRP+X←(ρBP)[1]
[10] BRPTS[(PNTRS[S;1]-1)+ιX; 2 1]←⊖BP
    ∇
```

FIG. 26i

```
    ∇ BRP←BQ SSUM BR;N;S;R
[1]   ᴀ----Figure 26i----
[2]   S←BQ MAPAT BR[;1] ᴀ→→→→Figure 26j
[3]   R←S>0
[4]   →((BQ[1;1]=BR[1;1])∨S[1]=-MI)/'S←R/S'
[5]   BRP←((R∨N=(ρBR)[1])/[1]BR)+⍉(2,N)ρ((N←ρS)ρ0),|S
[6]   S←BR MAPAT BQ[;1]
[7]   R←S>0
[8]   →(S[1]=-MI)/'S←R/S'
[9]   BRP←BRP,[1]((R∨N=(ρBQ)[1])/[1]BQ)
                    +⍉(2,N)ρ((N←ρS)ρ0),|S
[10]  BRP←BRP[⍋BRP[;1];]
    ∇
```

FIG. 26j

```
    ∇ VALUE←BRKP MAPAT XX;Y;I;I1;I2;J;VAL;SXX;X
[1]   ᴀ----Figure 26j----
[2]   →(0=+/+/BRKP)/'→+/VALUE←(ρXX)ρ0'
[3]   VALUE←(SXX←ρXX)ρ0
[4]   J←1
[5]   NXPT:X←XX[J]
[6]   I←(ρBRKP)[1]
[7]   VAL←((X<I2),((X≥I2←BRKP[1;1])∧
                X≤I1),X>I1←BRKP[I;1])/((-MI),0,BRKP[I;2])
[8]   →(VAL≠0)ρSET
[9]   I1←(X≥BRKP[;1])⍳0
[10]  I2←(X≤BRKP[;1])⍳1
[11]  X←X-BRKP[I+I1-1;1]
[12]  →(I1≠I2)/'VAL←-BRKP[I2;2]'
[13]  →(I1=I2)/'VAL←Y+X×(BRKP[I1;2]-Y←BRKP[I;2])
                    ÷BRKP[I1;1]-BRKP[I;1]'
[14] SET:VALUE[J]←VAL
[15]  →(SXX≥J←J+1)ρNXPT
    ∇
```

METHOD FOR GENERATING AN OPTIMIZED NESTED ARRANGEMENT OF CONSTRAINED RECTANGLES

TECHNICAL FIELD OF THE INVENTION

The present invention relates to information handling systems and more particularly to automatic process control systems.

The invention can be applied in production environments where rectangles are dissected into smaller rectangles and where the usefulness and the quality of the dissection depend on the position of the rectangles relative to each other and to the enveloping rectangle. Two environments, where such a dissection directly affects the costs and the quality of the products, will be described to illustrate the involvement.

The first is a stock-cutting task, where a machine is capable of dissecting rectangular sheets up to a certain size by a cut parallel to one of the sides and all the way across that sheet. The properties of the material may vary over the sheet so that, depending on the requirements, the smaller rectangles are preferably taken from specific regions of the sheet. Also the amount of waste material must be kept small. The invention can be used to drive the cutting machine on the basis of quality measurements on the sheet.

A second and probably more important application of the invention is in the production of mask patterns for circuit integration by semiconductor technologies. The complexity of these patterns, measured in the number of elementary patterns, such as rectangles, has increased enormously, and made it necessary to employ digital computers to assist in or take over the handling of the data to be processed during the design of mask patterns. But even with the help of a computer the size of the problems may still be unmanageable. Today's microelectronics technology makes systems with millions of elementary patterns feasible. The design complexity of these so-called very large scale integrated (vlsi) circuits makes new functional design methodologies imperative.

It has been conjectured that complex systems evolve far more quickly if they are of hierarchic nature (i.e. composed of interrelated subsystems, each being hierarchic in structure, until some lowest level of elementary subsystems is reached) than non-hierarchic systems of comparable size. Therefore, a hierarchical design methodology is probably the only feasible approach for developing new vlsi circuits from user-oriented specifications.

Software systems for generating the mask patterns of today's integrated circuits have to accept a functional description, whether or not hierarchically specified, and must be capable of producing a layout satisfying rules depending on the fabrication technology and the required performance of the circuit.

The invention disclosed in this application fits in such systems.

PRIOR ART

A rectangle dissection problem was formulated in 1940 by R. L. Brooks, C. A. B. Smith, A. H. Stone, and W. T. Tutte in their article *The dissection of rectangles into squares* in Duke Math. Journal, Volume 7, pages 312 up to 340. The topologies of the dissection they were after, are exactly those the present invention excludes. Consequently, their methods (and methods of the mathematicians solving the same problem) do not teach nor suggest the present invention.

A reduction of complexity obtained by restricting the topology of the dissection to those generated by the present invention was recognized by P. C. Gilmore and R. E. Gomory when solving cutting stock problems. Their results were published in Operations Research, Volume 13, pages 94 up to 120, in 1963. Their major concern was to minimize waste material when a number of fixed rectangular sheets of material had to be cut out of a big rectangular sheet. The position of each rectangle in relation with the positions of the other rectangles was not important.

In 1979 U. Lauther presented a placement algorithm for rectangles with fixed shapes at the 16th Design Automation Conference. The method is described in Journal of Digital Systems, Volume 4, pages 21 up to 34 issued in 1980. In the first part, however, the shapes do not affect the process, only the areas and the nets interconnecting the subsystems to be allocated in the rectangles are taken into account. The outcome of this first part is a topology, though somewhat more constrained, consistent with the rules for topologies generated by the method according to the present invention. The other parts of that system do not preserve the topology delivered by the first part, and allow more general building block configurations.

Also in 1979, a layout design system called MIRAGE was announced at the 16th Design Automation Conference in San Diego, as can be read at pages 297 up to 304 of the Proceedings of the 16th Design Automation Conference. Although the example satisfies the topology constraints of the invention, no method for generation of these configurations is described or reported.

The necessity of a layout system that accepts a functional hierarchy as useful information for a layout generating process, was published in 1978 by B. T. Preas and C. W. Gwynn, *Methods for hierarchical automatic layout of custom lsi circuit masks*, Proceedings of the 15th Design Automation Conference, pages 206 up to 212. A complete embodiment is not described, but from what has come to the knowledge of the applicant it is clear that—if an embodiment of that idea exists—it uses building block formulations with rigid shapes for the rectangles.

*The genealogical approach to the layout problems,* published by A. A. Szepieniec and the applicant of the present invention in Proceedings of the 17th Design Automation Conference, pages 535 up to 542, in 1980, has exactly the same topology restrictions as this invention. However, in the first part of the genealogical approach the generation of this topology does not follow a strictly top-down slicing process. It starts with the placement of some rectangle around which other rectangles are placed in accordance with the topological restrictions. Consequently, the interrelations are not taken into account in a global way as they are in the present invention where a two-dimensional point configuration is generated on the basis of the whole interrelations structure. The genealogical approach only considers nets connecting the subsystems in the already placed rectangles with those that are not yet placed. The second part does proceed in a top-down manner, but it uses a merging instead of a slicing process. The global interrelation structure does not have priority as it has in this invention. Therefore, the techniques employed in the genealogical approach to obtain the topology of the configuration cannot be used in the topology part of an embodiment of the present invention.

In case all given rectangles have fixed shape and size, but free orientations, an algorithm described by L. Stockmeyer in IBM Research Report RJ 3731 can be used in the last part of an embodiment of this invention. The method according to the present invention is a generalization, and is capable of optimizing configurations of a mixture of fixed and flexible rectangles with or without free orientations, and with wiring areas of given width.

Some of the subtasks arising in an embodiment have well-known sometimes even standard solutions. For the method according to the preset invention, they will be mentioned at the appropriate places. The more specific, but for the embodiment preferred, methods will be described and given in the form of implementations in the figures.

The prior art discussed above does not teach nor suggest the present invention as disclosed and claimed herein.

BRIEF DESCRIPTION OF THE DRAWINGS

The first three figures support the definitions of the next section DISCLOSURE OF THE INVENTION.

FIGS. 5 through 26j are described in the DESCRIPTION OF A PREFERRED EMBODIMENT. They contain flow diagrams and APL implementations of blocks that are not further decomposed in more detailed flow diagrams. Further some drawings are included to enhance understanding of the operating principles and the storage structures of the embodiment.

DISCLOSURE OF THE INVENTION

Figure 1A:
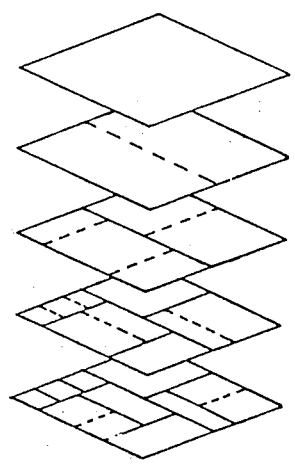
FIG. 1a is a visualization of the steps of a slicing process. The final configuration is in FIG. 1b, and its topology is in FIG. 1c.
Figure 1B:
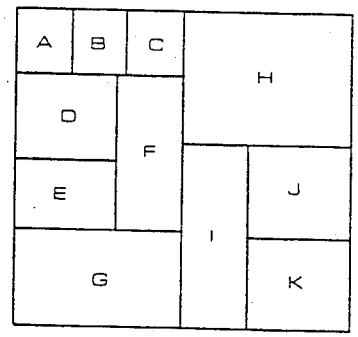
Figure 1C:
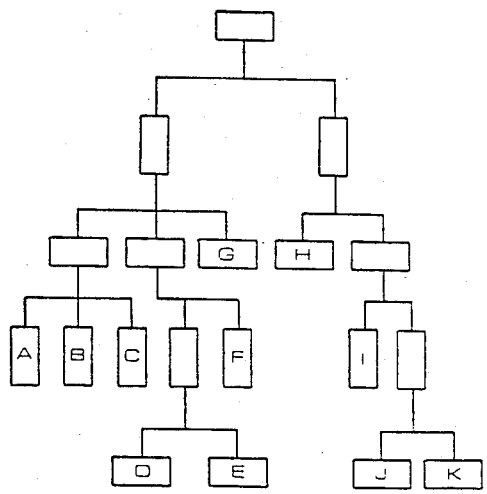
Figure 2:
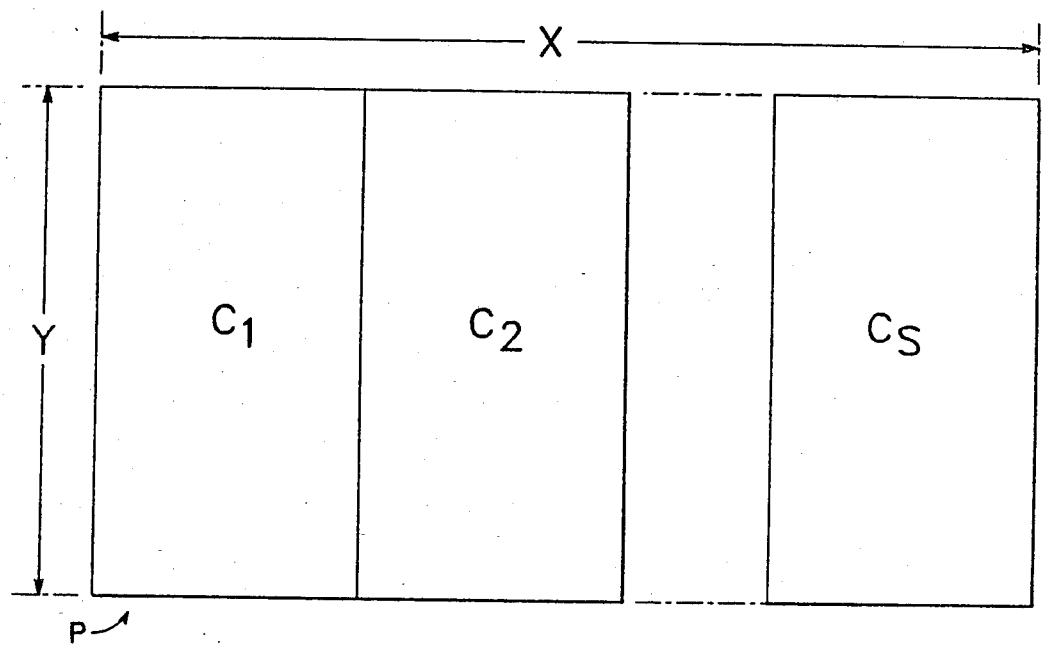
FIG. 2 is an example of a slice P. Each C is a child slice of P. P is their parent. $C_i$ is the next sibling of $C_{i-1}$. The C's are all siblings of each other. X is the longitudinal dimension of P, and Y is the latitudinal dimension of P as well as the longitudinal dimension of each C.
Figure 3A:
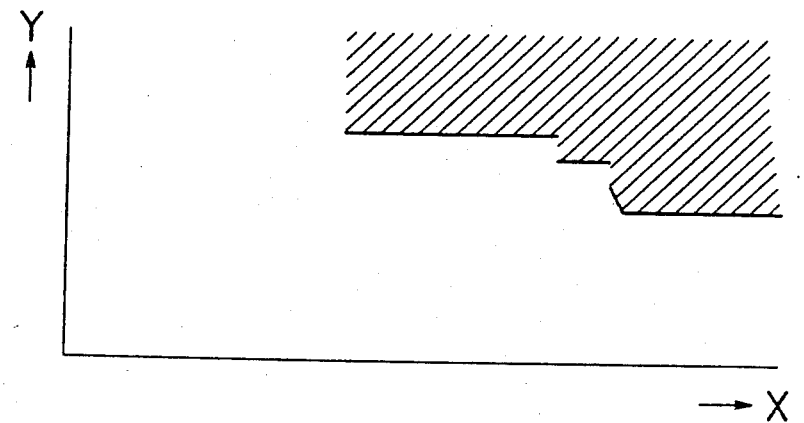
FIGS. 3a and 3b are examples of a bounding function and its inverse. The shaded region is the bounded area.
Figure 3B:
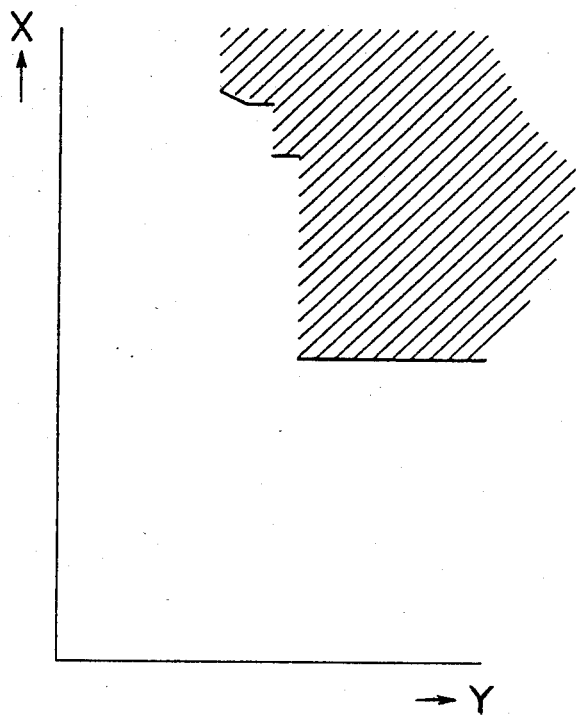

For uniformity of terminology the following definitions of a number of terms have been employed.

A rectangle dissection is a geometrical configuration consisting of non-overlapping rectangles that together completely cover an enveloping rectangle.

A slice is either an undissected rectangle or a rectangle dissected into slices by cutting lines parallel to one of the sides of the rectangle.

A slicing structure is a rectangle dissection that can be obtained by recursively dividing rectangles into smaller rectangles by parallel lines.

The slices obtained by dissecting a slice over all its parallel cutting lines are called the children or child slices of the dissected slice and siblings or sibling slices of each other. By maintaining a consistent ordering among sibling slices (e.g. left to right, and top to bottom) each of the sibling slices except one has a unique next sibling separated from it by exactly one cutting line. The dissected slice is called the parent or parent slice of the obtained slices. An undissected rectangle in a slicing structure is called a cell.

The topology of a slicing structure is a tree with each slice represented by a node, and arcs from each node representing a parent to each node representing one of its children, leaving the parent's node in accordance with the ordering of the children.

The longitudinal dimension of a slice is the dimension it inherits from its parent slice. The other dimension is its latitudinal dimension. The lattitudinal dimension of the common ancestor slice is the length of the side it transmits to its child slices. The other dimension is its longitudinal dimension.

A bounding function is a right continuous, non-increasing, positive function of one variable defined for all real values not smaller than a given positive constant.

The bounded area of a bounding function f is the set of pairs of real numbers (x,y) such that f(x) is defined and $y \geq f(x)$.

The inverse $f^{-1}$ of a bounding function f is a bounding function defining a bounded area with exactly those (y,x) for which (x,y) is in the bounded area of f.

The shape constraint of a rectangle is a bounding function of its longitudinal dimension. The bounded area of that function is the set of all permissible pairs of longitudinal and latitudinal dimensions.

A contour score is a function of two variables, defined for all pairs of positive real numbers, and which is quasi-concave and monotone in its two arguments.

In assembling a number of rectangles, each limited by a shape constraint, within one enveloping rectangle of which the dimensions are the arguments of a contour score to be minimized, and where the positions of the rectangles are related to the usefulness of the final configuration, a generation in accordance with this invention can be achieved by a sequence of procedures that accepts the description of the rectangles in the form of their shape constraints, and their interrelations in the form of
 an incidence structure,
 a distance function,
 a weight function,
 a combination thereof or
 other data from which mutual proximities (or distances) can be derived,
   which are transformed into a point configuration in the plane,
 or a configuration of points in the plane, each point representing a rectangle,
   from which a slicing structure is derived,
 or relative positions in a slicing structure, and that on the basis of that slicing structure estimates the space
required for the realization of the interrelations, finally yielding a configuration of rectangles within an enveloping
 rectangle, satisfying the given shape constraints on these rectangles, leaving the estimated space for the realization of the interrelations and optimal under these constraints with respect to the given contour score.

In accordance with this invention three procedures are required. The first procedure, TOPOLOGY, must deliver a topology for the slicing structure, on the basis of the available data. The second procedure, JUNCTOR, estimates the space required for realizing the interrelations between the rectangles with relative positions in accordance with the obtained slicing structure. The third procedure, GEOMETRY, determines the dimensions and positions of the rectangles such that the value of the contour score is optimized over all possible longitudinal and latitudinal dimensions of the enveloping rectangle.

Also needed, of course, are structures for storing the intermediate data such as the topology, the space estimations, the bounding functions, etc.

DESCRIPTION OF A PREFERRED EMBODIMENT

The embodiment to be described with reference to FIGS. 5 through 26j, is the invention as applied to mask pattern generation for large scale integration. The preferred environment is a hierarchical functional design system. A hierarchic system or a hierarchy is either a system composed of interrelated subsystems, each of the latter being hierarchic in structure, or an elementary system. The systems in a hierarchy are called modules. A hierarchy can be represented by a tree. Each vertex in such a tree represents a module. An arrow from a vertex points to the subsystems (submodules) of the module it represents. The incoming arrow refers to its (unique) supermodule. The one module without an incoming arrow, the root, represents the whole system. The elementary subsystems are represented by the leaves, vertices without outgoing arrows.

In such an environment a program calls for each of the nonelementary modules the procedure FLOORPLAN which is a particular embodiment of the invention. The sequence in which the modules are treated is strictly top-down. This means that a module is never treated by FLOORPLAN before its supermodule is. After completion of FLOORPLAN for all modules composed of more than one submodule, the program calls the appropriate procedures for the elementary modules. Then, in bottom-up sequence (i.e. child slices have to be treated before their parent slice is treated), the program realizes the interconnections in the reversed spaces called junction cells, and puts everything together by assigning absolute coordinates to all patterns.

The direct environment of the embodiment to be described can be best given in a pseudo-pascal text
module list: = (root);
while module list is not empty do
  begin select M from the module list;
    delete M from module list;
      FLOORPLAN (M);
    add {non-elementary submodules of M} to module list end;
After completing the above loop the elementary modules get a complete layout assigned to them, either by calling technology and style dependent layout generation routines, or by assigning an orientation to some stored layout image. Then, in a bottom-up manner, the modules are combined by completing the wiring spaces between them. (Bottom-up means that all child slices must be completed before their parent slice can be treated.) The process is finished when the common ancestor has been treated.

Figure 4A:
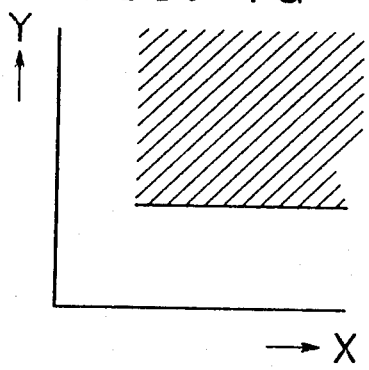
FIGS. 4a and 4b show some elementary shape constraints.
Figure 4B:
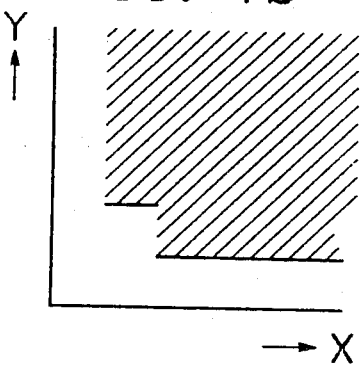
Figure 4C:
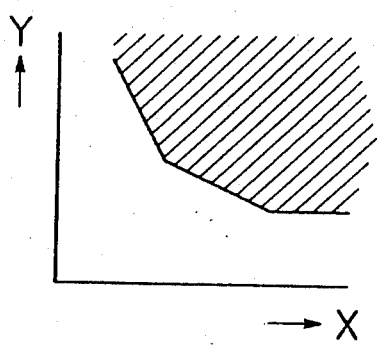

The input available to FLOORPLAN contains the modules, their shape constraints, and proximity relations between the modules. Sometimes more information is available, such as the distribution of pins over the sides of a module, or even the exact location of the pins relative to the module. The latter is the case, for example, for inset cells. These are cells of which the complete layout is stored in some library. For the embodiment these cells are rectangles with fixed dimensions. The pin information can be used to give the cell an orientation in an early stage of the FLOORPLAN, if an orientation is not prescribed. The shape constraint of an inset cell with fixed orientation relative to its slice is like the one in FIG. 4a. The shaded areas indicate the bounding area. FIG. 4b gives a shape constraint of a non-square inset cell with free orientation. Another extreme example of a module is a flexible cell. Mostly, only a lower bound on the area is given for such a module, though a square shape generally is preferred. Its shape constraint looks like the one in FIG. 4c. The distribution of its pins over the sides is not known when FLOORPLAN is called.

Several kinds of proximity data are possible, such as a distance matrix, a weight matrix, and a net list. Sometimes more specific information about the interrelations is available, such that parts of the embodiment can be bypassed. For example, when an acceptable point configuration is available, EMBED does not have to be called. When a topology is available, the whole TOPOLOGY part can be skipped.

Commonly, the relations between the modules are given in the form of a net list. This is an incidence structure where the modules are considered as sets of pins. The nets are also considered to be sets of pins. The net list indicates whether a module and a net share a pin.

Modules and nets are identified in FLOORPLAN by positive integers. The embodiment uses the fact that the position of a module or a net in certain data structures corresponds with the identifying number.

With m modules and n nets the net list can be represented by a $(0-1)$ matrix $P_{mn}$. There are one-to-one correspondences between the rows and the modules, between the columns and the nets, and between the pins and the nonzero entries of P. An entry $p_{ij}$ equals 1 if the corresponding module and net share a pin. Otherwise $p_{ij}=0$. Certain nets are critical, which means that it is important to keep them small. The criticality sometimes can be measured by a weight. Adopting the same order for the nets as in P the weights assigned to the nets can be represented by a positive vector $w_n$. The higher the weight of a net, the closer the modules connected by this net should be together.

Figure 5:
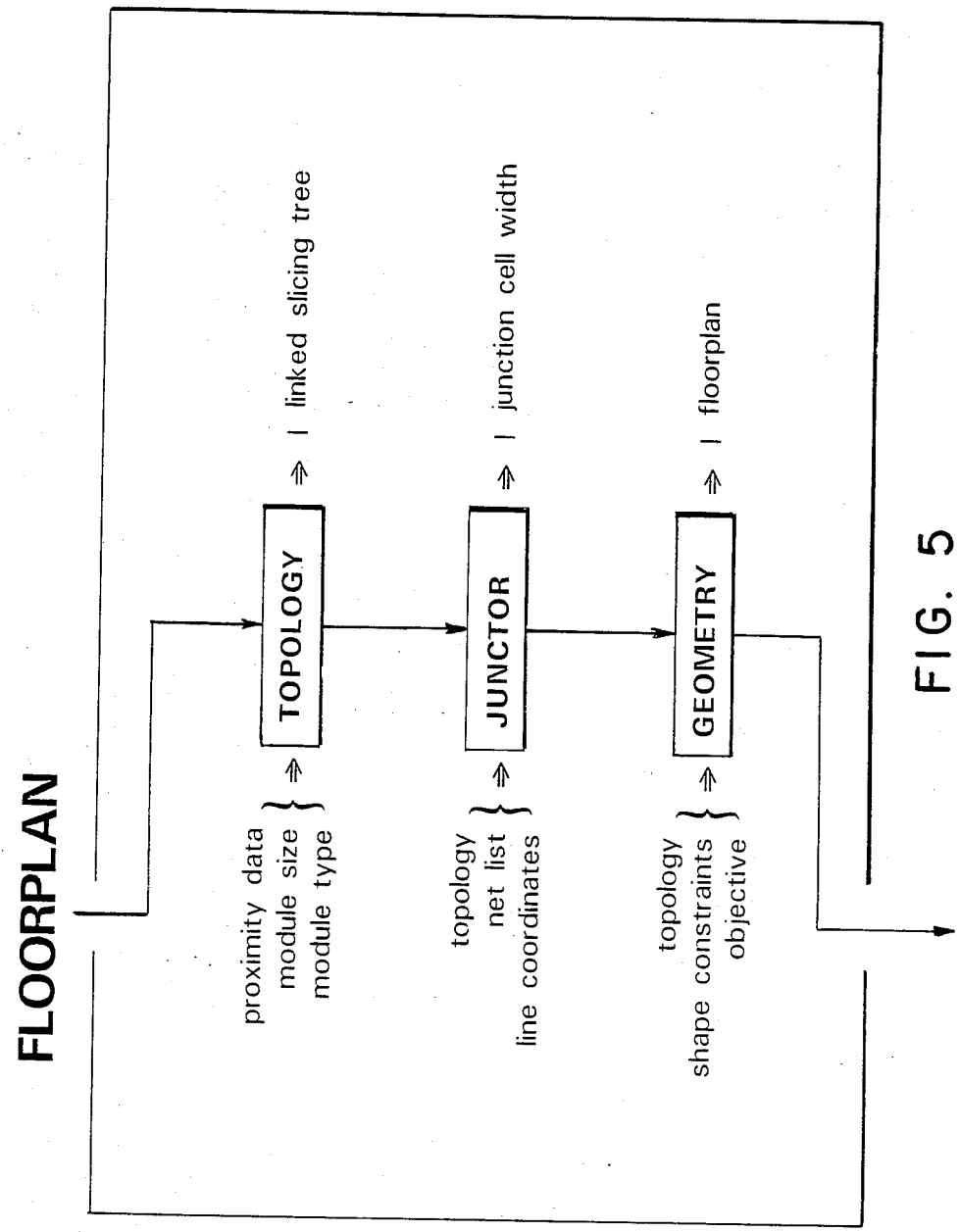
Figure 6:
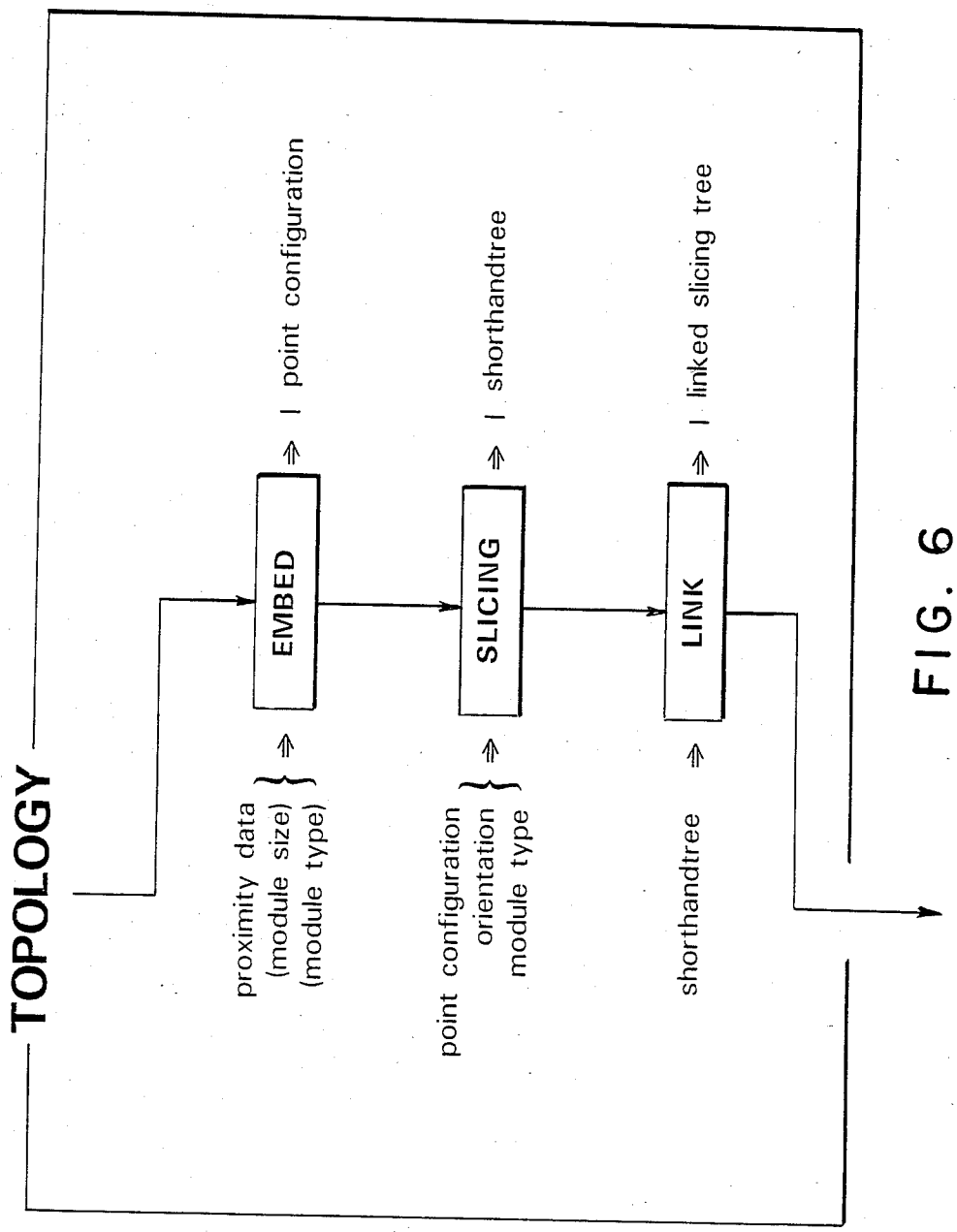
Figure 7:
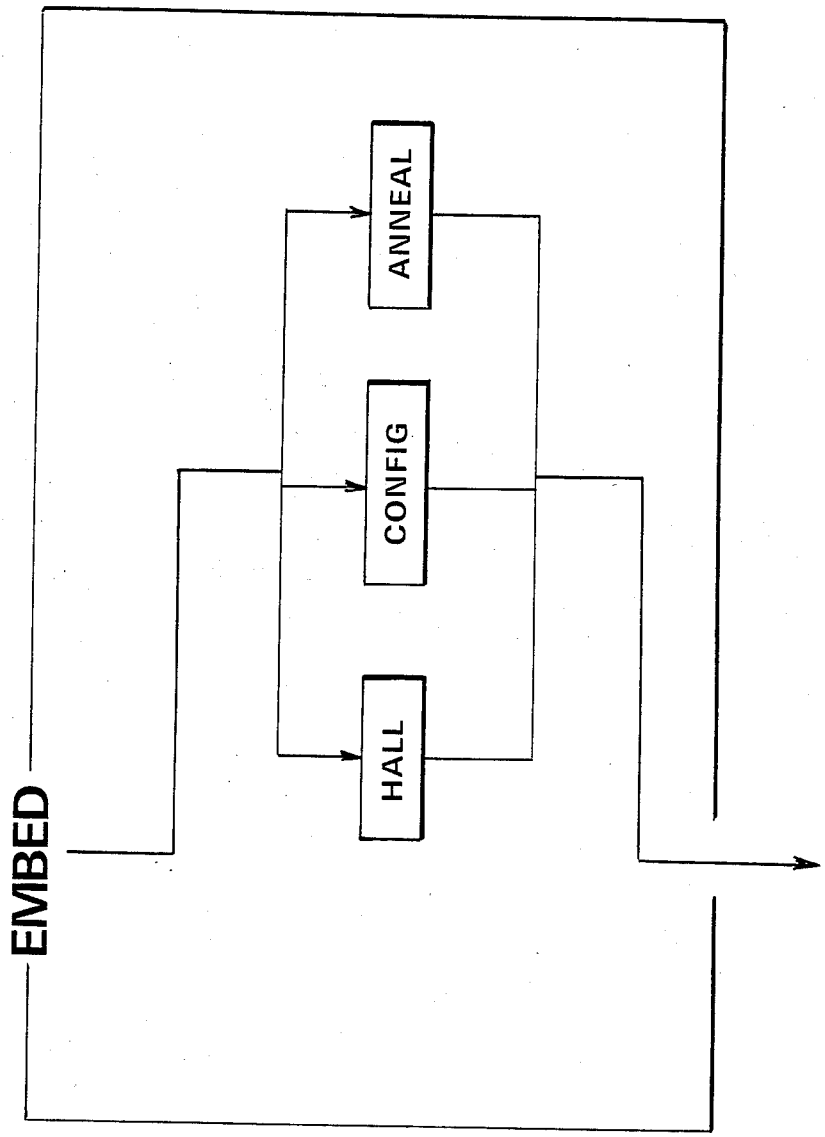

Unless the topology of the required configuration is already among the available data, an embodiment in accordance with the invention first processes the available data in a procedure called TOPOLOGY, as indicated in FIG. 5. This procedure has to generate the topology of the slicing structure. It does so in the three stages given in FIG. 6, of which the first can be bypassed if a suitable point configuration in two dimensions is given in the available data. Every module to be accommodated in the enveloping rectangle must be represented in this configuration by a point, and the distances between two points must reflect the interrelation of the corresponding modules. If not available such a point configuration has to be generated in EMBED, the first stage of TOPOLOGY. The second stage, SLICING, produces a topology of a slicing structure in which the relative positions of the points are mainly preserved, and points close to each other are contained in many slices, if other requirements do not prevent that.

The two-dimensional point configuration can be stored in two vectors, x and y, where $x_i$ and $y_i$ are the coordinates of the point representing module i.

There are many ways described in literature to obtain a point configuration from data exhibiting the interrelation of objects. Three of them, mentioned in FIG. 7, will be described. One method frequently used in the context of circuit integration was described by Kenneth M. Hall in 1970 in his article 'An r-dimensional quadratic placement algorithm' that appeared in Management Science, volume 17, pages 219 up to 229. It can be used in an embodiment of the invention if the interrelations can be measured by a weight function. Given a symmetrical matrix W, where element $w_{ij}$ quantifies the desirability of having the modules i and j close to each other, the method described by Hall minimizes $\Sigma\Sigma\ w_{ij}d_{ij}$, where $d_{ij}$ is the euclidean distance between the points i and j, under certain conditions that guarantee a certain spread in the configuration, but are mainly chosen for convenience.

The function CONFIG of FIG. 8 needs a distance matrix. This matrix can be input, or has to be generated before SCHOENBERG (see Equation (2)) is called. If the interrelations between the modules are given as a netlist, possibly with a weight vector for the nets, it can be transformed into a distance space. Among the many possible transformations the dutch metric appeared to be the most satisfactory. Its mathematical definition is given in equation 1.

$$\overline{D^2} = J_{mm} - (PI(w)P^T)/(w^Tj_n)J_{mm} - FI(w)F^T) \tag{1}$$

where F has a one where P has a zero and the other way around. An implementation yielding the distance matrix according to this formula is in FIG. 9, the function DUTCH.

A bar over a matrix or vector operation indicates that the operation is to be performed elementwise. I(v) is a diagonal matrix with the elements of the vector v on its diagonal. $J_{mn}$ is an m×n matrix of all ones. $j_n$ is a vector of length n with all ones.

Having obtained a distance space for the set of modules by whatever method, SCHOENBERG with the functions called by SCHOENBERG can be used to obtain a point configuration. The coordinates of the points in such a configuration are the components of eigenvectors associated with the two largest eigenvalues of the Schoenberg matrix of the distance space, where a Schoenberg matrix is defined as $$-\tfrac{1}{2}Z\overline{D^2}Z \tag{2}$$

Here D is the distance matrix of the distance space and $Z_{mm} = I(j_m) - J_{mm}$.

The resulting point configuration in the euclidean plane always is optimal in the following sense:
In general, with an arbitrary distance matrix, applying SCHOENBERG results in a two-dimensional configuration of which the Schoenberg matrix S' is the best approximation of the Schoenberg matrix S derived from the original distance space, in the sense that $$\psi = j_m^T(S-S')^2 j_m \tag{3}$$

is minimal, i.e. the sum of the squares of the differences between corresponding entries of S and S' is minimal.

If, however, the given distance space is embeddable in some (r-dimensional) Euclidean space (i.e its Schoenberg matrix is positive semidefinite and of rank r or less), the obtained configuration also minimizes $$\phi = \sum_{i=1}^{m} \sum_{j=1}^{m} |d_{ij}^2 - d'^2_{ij}| \tag{4}$$

where $d'_{ij}$ are realized instead of $d_{ij}$.

An implementation of the functions is given in FIGS. 10a–10c.

Another way of deriving a point configuration from net list data that is useful in the context of mask pattern generation is by making use of the principle of simulated annealing, described by Gelatt and Kirkpatrick in U.S. Pat. No. 4,495,559, entitled Optimization of an Organization of Many Discrete Elements. As stated there four elements have to be specified. The first element is a means for describing the configuration. Here, the sequence of the points in two perpendicular directions is chosen. The second element, a means for introducing local changes, is an elementary change in one or both of the sequences, for example the interchange of two arbitrary points. The third element is an objective function defined for all possible configurations and to be minimized by the procedure. Minimization of the expected length of the interconnections often is a suitable objective. If the distances between the points realistically represent the distances between the centers of the rectangles the ensuing interconnection length can be estimated quite accurately. To obtain this situation the points in each sequence are displaced such that the interspaces are proportional to the sum of the iso-oriented sides of the corresponding rectangles. Thus, the vectors x and y are formed. To avoid trivial solutions also the correlation between the two vectors defined in equation (5) has to be small.

$$\left| \frac{x \cdot y}{\sqrt{x \cdot x \times y \cdot y}} \right| \tag{5}$$

The objective function calculated by OBJECTF in FIG. 11f is $$constant \times (1 + weight \times correlation) \times (wirelength-plateau)$$

where correlation is defined in equation (5) and wirelength is the sum over all interspaces of the product of the number of interconnections crossing a line in this interspace and the length of the interspace. The interconnections that have pins in the environment of which the location is known, can be taken into account by entering them at the appropriate extremes of the sequences. Constant, weight, and plateau are positive constants by which the relative influence on the individual contributions can be controlled. The fourth element is a heating and annealing schedule that has to be set on the basis of experiments. In the functions of FIG. 11 this schedule can be controlled by setting ACCRATE, NR1, NR2, and NR3. Better is to have the program setting them dynamically on the basis of the available data.

If there are inset cells with quite oblong shapes, it is better to have the orientations fixed before entering the second stage of TOPOLOGY. For inset cells the distribution of the pins over the sides is known. In case SCHOENBERG was used to obtain the point configuration a suitable orientation can be determined in the following way. For each such a module side a characteristic vector $v_n$ can be derived, indicating by a component 1 whether it has a pin connected to the corresponding net, and by a component 0 the absence of such a pin. Also the dutch distance of v to all rows of P can be calculated. Now, when a point is added to the r-dimensional Schoenberg configuration having exactly those distances to the corresponding module points (at most one extra dimension is needed for this addition), the position of its projected point in the two-dimensional configuration will be $$\left( \frac{\sum_{i=1}^{m} q_{i1}(s_{ii} - d_i^2)}{2\lambda_1}, \frac{\sum_{i=1}^{m} q_{i2}(s_{ii} - d_i^2)}{2\lambda_2} \right) \quad (6)$$

where $s_{ii}$ is the i-th diagonal element of the Schoenberg matrix S, $\lambda_1$ and $\lambda_2$ the largest eigenvalues of S, and $d_i$ is the dutch distance of v to $p_{i.}$. Thus, two simple calculations give the position at which the module side 'would like to be' if it were separable from its module. The vector obtained by substracting the module point coordinates from the result of (6), can be interpreted as a force vector. Such a vector can be determined for each side. Thinking of the module as a rectangle with minimum area, fixed position of its center, and the four 'forces' applied to the centers of the respective sides, an amount of potential energy is associated with each of the eight possible orientations. The one with minimum energy is selected.

A slight modification in the elements of the simulated annealing method will give orientatons to the inset cells while generating the two dimensional point configuration. When other methods of obtaining the point configuration in the plane are chosen, force methods similar to the one in the SCHOENBERG case can be used on the basis of the point positions derived.

Figure 12A:
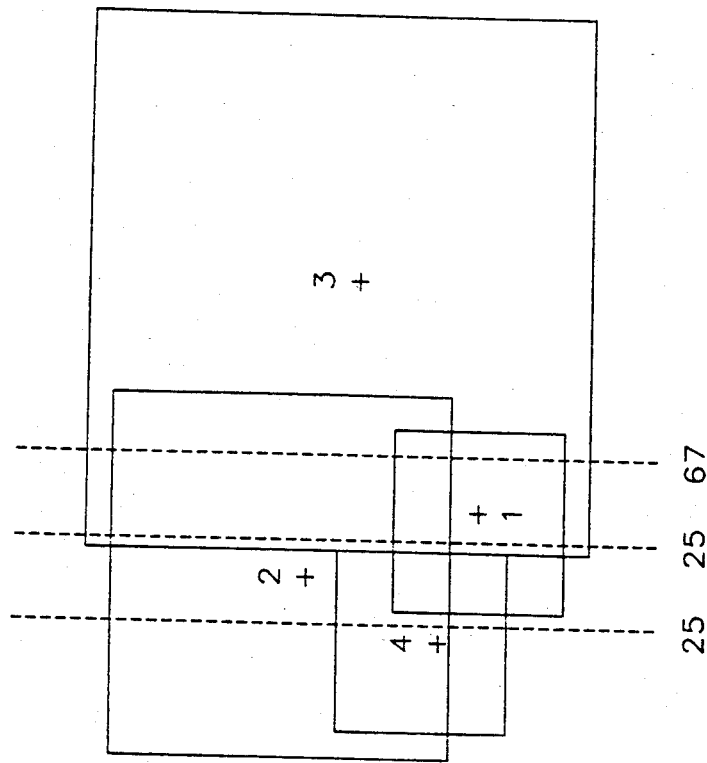
Figure 12B:
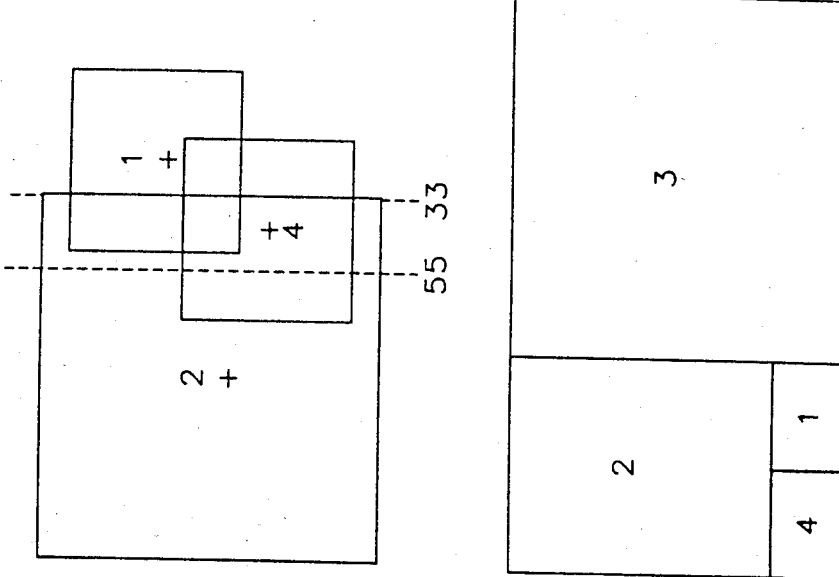
Figure 12C:
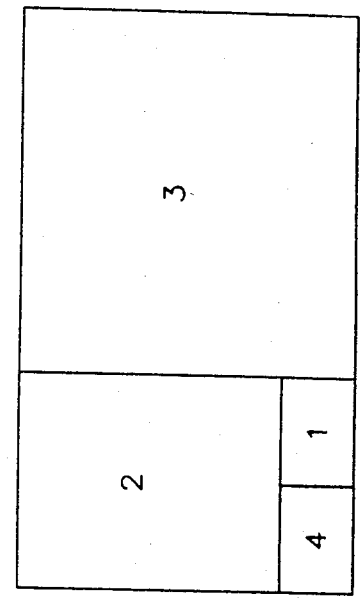
Figure 15A:
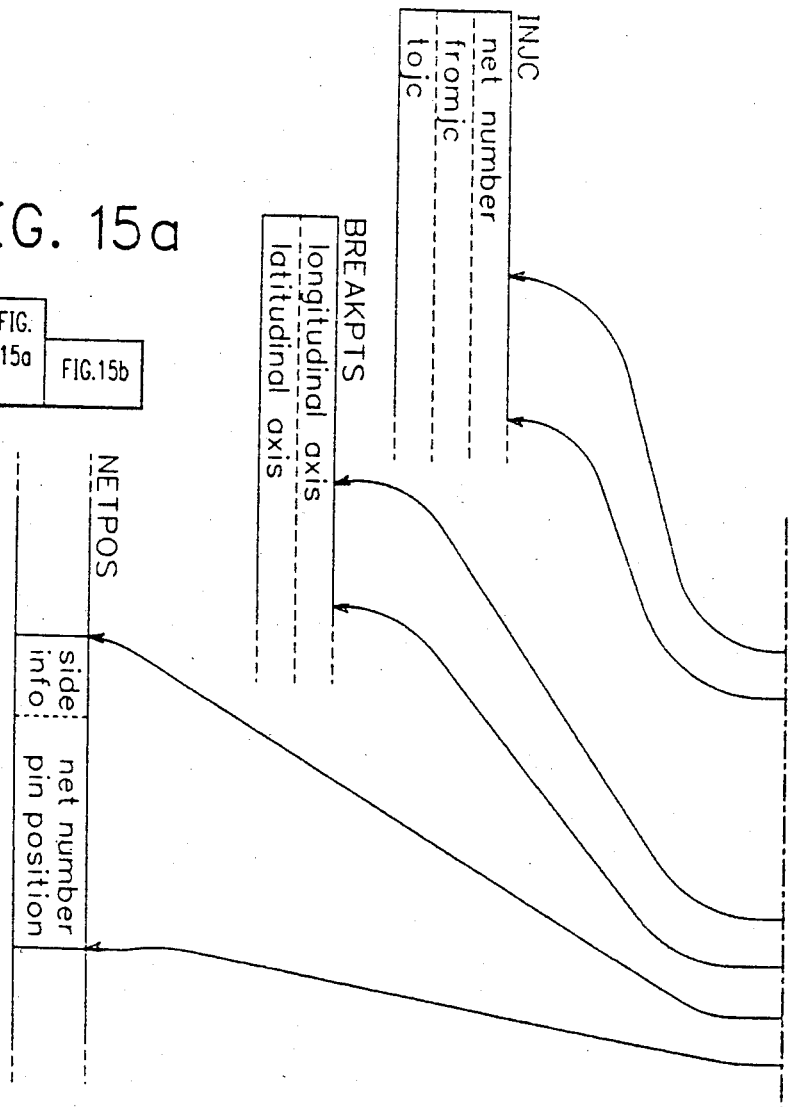

The second stage of TOPOLOGY is to derive a slicing structure from the point configuration obtained as a result of the functions in the first stage, or from another source. This function, called SLICING, has to preserve the relative positions in the slices for the modules as given by the point positions. To obtain information about which modules should be kept together in slices and which should be in different slices after a certain level, a shrinking process can be used. Suppose a given slice L with $s \geq 2$ modules is to be sliced in a number of child slices. Slicing must be tried in the direction perpendicular to the lines separating P from its sibling slices. FIGS. 12a–12c are a visualization of a process determining the shrink factor of every possible slicing line. Then that factor will be defined more precisely and more faithful to the computational process implemented in DETSHR of FIG. 13e.

Think of a module as a rectangle around the point representing it and with its sides parallel to the x- and y-axis in accordance with the orientation determined in EMBED. The sizes of these rectangles are such that each pair of rectangles has overlap and the ratio of their areas is equal to the ratio of the area estimates given to the corresponding modules. The rectangles are simultaneously shrunk leaving their centers fixed and preserving the area ratios. At some point during this shrinking process there will be a line that divides the modules in two blocks without intersecting any of the rectangles. The amount of shrinking necessary to reach that point is the shrink factor to be assigned to the corresponding line. Shrinking is continued and another line perpendicular to the longitudinal axis and separating other blocks will be intersection free. Again, the corresponding factor will be assigned to that line. The process is continued until all s−1 factors are assigned. The lines with the highest shrink factors are candidates to be accepted as slicing lines. However, since a preliminary geometry for each of the new slices can be calculated simultaneous with the slicing process, other information can be derived before deciding which of the slicing lines are acceptable, such as area distribution over the new slices, aspect ratios of the new slices, and the deformation (if suitably defined) the modules between consecutive slicing lines certainly will incur. To illustrate this point an embodiment of the last possibility will be described after completion of the precise implementation of shrink factor calculation. Once the set of accepted slicing lines has been determined, the resulting blocks will form the child slices, each of which will be treated in the same way if it contains more than 1 module.

In the small example of FIG. 12a the rectangles—in this case squares—around the module centers are drawn in their position before the shrinking process. The amounts of shrinking necessary to have the vertical dashed lines intersection free are given for each line. After accepting $/_3$ the three modules at the left are shown in FIG. 12b, and treated in the same way. The consequences for the shorthand tree are given for each step. The final tree and configuration are in FIG. 12c. More precisely:

The modules in L are ordered according to their longitudinal coordinate. Let $\pi(M)$ be the rank number of $M \epsilon L$ in that order. $x_{\pi(M)}$ be its longitudinal coordinate and $\xi(M)$ be the iso-oriented dimension. There are in general s−1 possible slicing lines (the only exception occurs when modules have the same coordinate; a slicing line separating those modules gets shrink factor 0). Slicing line $/_i$ will separate the modules in $L_i^- = \{\pi^{-1}(j) | j \leq i\}$ from those in $L_i^+ = \{\pi^{-1}(j) | j > i\}$. The shrink factor assigned to $/_i$ is $$F_i = \text{MIN}\{f | \quad x \epsilon [x_i, x_{i+1}] \quad 1 \leq j \leq s \quad (7)$$

$$[x_j - \tfrac{1}{2}f \sqrt{\xi(\pi^{-1}(j))} < x < x_j + \tfrac{1}{2}f \sqrt{\xi(\pi^{-1}(j))}\ ]\}$$

The computation of $F_i$ is quite simple. The initial f, $f^0$, must be large enough such that $$\bigcup_{j=1}^{s} (x_j - \tfrac{1}{2}f^0 \sqrt{\xi(\pi^{-1}(j))}, x_j + \tfrac{1}{2}f^0 \sqrt{\xi(\pi^{-1}(j))}\ ) \quad (8)$$

is an interval. At each iteration step $h_p$ and $k_p$ are determined by solving $$x_{h_p} + \tfrac{1}{2}f^{p-1} \sqrt{\xi(\pi^{-1}(h_p))} = \quad (9a)$$

$$\text{MAX}\{x_j + \tfrac{1}{2}f^{p-1} \sqrt{\xi(\pi^{-1}(j))} \mid \pi^{-1}(j) \epsilon P_i^- \}$$

$$x_{k_p} - \tfrac{1}{2}f^{p-1} \sqrt{\xi(\pi^{-1}(k_p))} = \quad (9b)$$

-continued $$MIN\{x_j - \tfrac{1}{2}f^{p-1}\sqrt{\xi(\pi^{-1}(j))} \mid \pi^{-1}(j)\epsilon P_i^+\}$$

by iteration.

The value of $f^p$ is set to $$f^p := \frac{2(x_{k_p} - x_{h_p})}{(\sqrt{\xi(\pi^{-1}(h_p))} + \sqrt{\xi(\pi^{-1}(k_p))}) \prod_{q=1}^{p} f^{q-1}} \quad (10)$$

The process is continued until $f^p = 1$. Then $$F_i = \prod_{q=1}^{p} f^{q-1}.$$

By accepting only the lines with the highest shrink factors the embodiment achieves that modules that have points at a relatively short distance will be separated in a relatively late stage of the process. This means that they will be together in many nested slices. Modules with points relatively far from each other will be separated after a few slicings. The relative positions of the modules in the final result will be quite accurately the same as the relative positions of the corresponding points in the point configuration.

As an illustration of the fact that an assessment of the shape of the child slices for a proposed set of slicing lines can be used for deriving additional figures of merit for that set beside the shrink factors a deformation calculation for flexible cells will be described as implemented in FLEXDEF, given in FIG. 13j.

The preferred shape for flexible modules is a square. It is, however, in general not possible to accommodate the modules of a set B as squares or other fixed shapes with area $\alpha(M)$ in a slice with area $$\Sigma(B) = \sum_{M \epsilon B} \alpha(M),$$

to say nothing of such a slice with given dimensions, $l_1$ and $l_2$. To assess the deviation from square form of the modules in B FLEXDEF uses the following definition:

$$def(B, l_1, l_2) = \quad (11)$$

$$\sum_{M \epsilon A} \left( \frac{\sqrt{\alpha(M)}}{MIN\{l_1, l_2\}} + \frac{MIN\{l_1, l_2\}}{\sqrt{\alpha(M)}} - 2 \right) +$$

$$def(B \backslash A, MAX\{l_1, l_2\} - \frac{\Sigma(A)}{MIN\{l_1, l_2\}}, MIN\{l_1, l_2\})$$

where $A = \{M \epsilon B \mid \alpha(M) > (MIN\{l_1, l_2\})^2\}$. When $A = \phi$ the deformation will be zero. This does not mean that all modules of B fit into an $l_1 \times l_2$ slice as non-overlapping squares. It only is an indication that the modules are small in comparison with that slice, and a reasonable packing can be expected.

To use this definition of deformation it must be possible to calculate the dimensions of the slices in a partial structure tree. With the areas for the leaves given, this is possible if, for example, the aspect ratio of the chip or the ancestor module is known. For the latter this will have been predicted by a previous call of floorplan.

The calculation of the dimensions of all slices starts with deriving the outer dimensions from the total area and the aspect ratio. One of these dimensions, the shortest, is inherited by the child slices of the ancestor. The other dimensions of these child slices are obtained by dividing the sum of the areas of the modules in each of them by the inherited dimension. Proceeding in this way, each slice inheriting the dimension calculated for its parent slice, will yield the dimensions of all slices.

Since the computation is performed in a top-down fashion, it can also be applied to partial structure trees. So, after the shrinking process the dimensions $l_1{}^s$ and $l_2{}^s$ of the slice accommodating the modules in L are known and so are the shrink factors of all possible slicing lines. Accepting the lines with the $c-1$ highest shrink factors would yield c child slices $C_1, C_2, \ldots, C_c$. So, for the embodiment described here, the deformation associated with this selection of lines will be $$DEF(c) = \sum_{i=1}^{c} \frac{1}{|C_i|} def\left(C_i, l_1{}^s, \frac{\Sigma(C_i)}{\Sigma(P)} l_2{}^s\right) \quad (12)$$

when $l_1{}^s$ is the dimension to be inherited.

The procedure DEFPREV of FIG. 13f used the deformation to derive threshold for shrink factors of lines to be accepted. This threshold is here 0 which corresponds with a very cautious slicing process. Whether the resulting deformation equals 0, can be determined without performing the calculations of (11) and (12). However, when even for $c=2$ there is nonzero deformation, the deformation of such a binary slicing must be calculated in order to be used in the comparison with other binary slicings in the same and in the perpendicular direction. In that case the line with the highest ratio of the shrinking factor over the deformation plus a positive real number is accepted either in the current stage, or in the next depending on its slicing direction, in spite of the deformation caused. The greater the positive number, the more determinative the shrinking factor will be. When this number is big enough, the procedure will simply take the line with the highest shrink factor. Of course, there are many variations possible on how to use shrink factors, deformation, and other measures in order to decide which lines to accept.

The program uses a special data structure for storing partial stucture trees. It is a one-dimensional array with $2m-1$ integers. The modules are represented as positive integers. After completion of the slicing structure these positive integers will be separated from each other by $m-1$ nonpositive integers representing the slicing lines. The values of these nonpositive integers indicate the level of slicing.

Initially all $m-1$ positions for the slicing indicators are filled with zeros. The positive integers are ordered according to the components of x. The procedures such as described in the preceding paragraphs, determine the first set of slicing lines to be accepted. At the corresponding positions in the array the zeros are replaced by a $-2$ (0 and $-1$ are reserved for separating interconnection regions around the total configuration).

In each of the subsequent steps the groups of (two or more) positive integers separated by negative integers are treated in a similar way. They are ordered according to the coordinates not used in the preceding step, and the positions corresponding to the accepted slicing lines are filled with an integer 1 lower than the indicator of the preceding step.

In the particular embodiment described here TOPOLOGY ends with the translation of the shorthand-tree into a triply linked structure. The algorithm LINK of FIG. 13k does that in a straightforward way.

SLICING and the functions called by SLICING for generating a slicing structure for flexible modules, and LINK are given in FIG. 13. The point configuration and the area of the modules, all flexible, are the arguments of SLICING. It further accepts the outer dimensions and the first slicing direction to be tried in the form of global variables.

Thus, when entering the second part of FLOORPLAN, all slices containing the functional modules are known and organized in a data structure where every slice has pointers to its parent slice, its primogenitive, and to its next sibling. A pointer nil indicates that the corresponding slice does not exist. This second part, called JUNCTOR, essentially gathers the information necessary for estimating the space required by the realization of the interrelations.

For the embodiment at hand nets are assigned to junction cells in a net by net sequence. Junction cells are slices that separate the sibling slices. In the topology of the slicing structure they form leaves that occur between the child slices that are not junction cells. The function given in FIG. 14, ADJC, adds these cells to the linked structure formed by LINK.

In order to understand the procedures of the described embodiment that follow, the datastructures holding the configuration data have to be known. This information is mainly stored in two structures, FLPL and NETL, which are to be explained with reference to FIGS. 15 and 16, respectively.

FLPL is a two-dimensional array, with 18 columns and as many rows as the number of slices. Four extra rows may be added for the external junction cells surrounding the whole configuration. The first four columns (FIG. 15b) contain the linked slicing structure. The fifth column has the type number of the respective slice. The sixth column indicates for modules their orientation, and for compound slices the level in which they are contained. In the rows of the junction cells this field contains a negative integer, of which the absolute value indicates the level in which the corresponding junction cell occurs.

The modules of the input are surrounded by four junction cells. Each junction cell—except two of the cells framing the configuration—is between two other junction cells. This information is stored in the FLPL structure in columns 7 up to 10. The junction cell rows have in column 9 and 10 pointers to the array INJC. These pointers indicate the first and the last of a set of consecutive columns in INJC that give the nets occurring in this junction cell together with their entry and exit points. These entry and exit points are given by the respective intersecting junction cells. If a net has several pieces in the junction cell it is mentioned as many times.

Columns 11 and 12 give the preliminary dimensions of the respective slice. Columns 13 and 14 contain the coordinates of the lower left corner of the slice, calculated under certain assumptions, such as zero or non-zero channel width, full flexibility or constraints on the shape of the modules, and given or free aspect ratio.

Columns 15 and 16 have pointers indicating where in BREAKPTS the breakpoints of the shape constraints of the slice are stored. Except for those of the modules they still have to be derived. Finally, columns 17 and 18 have pointers to positions in the NETPOS array indicating the pin positions of each module, and later possibly those of the other slices. The first two column positions specify how these are distributed over the sides.

The other major data structure contains net based information. The first four columns (FIG. 16b) contain net information that is input to the procedures of FLOORPLAN. The fifth column contains the size, the length or some other measure which relates to the usefulness of a realization. The sixth column has the number of the smallest slice containing all the modules having a pin to be connected to that net.

Columns 7 and 8 have pointers referring to positions in the NTOMOD array. If the whole net has no pins outside the configuration, i.e. the net is local with respect to the configuration under construction, these pointers mark the range in which the modules connected by this net are given. If the net is global with respect to this configuration, and information concerning its entry point is available, that information is given in the first poistions of the range, while the other positions are used to list the modules connected by this net.

The last two columns of NETL point to the list of junction cells in which the net occurs.

Figure 17:
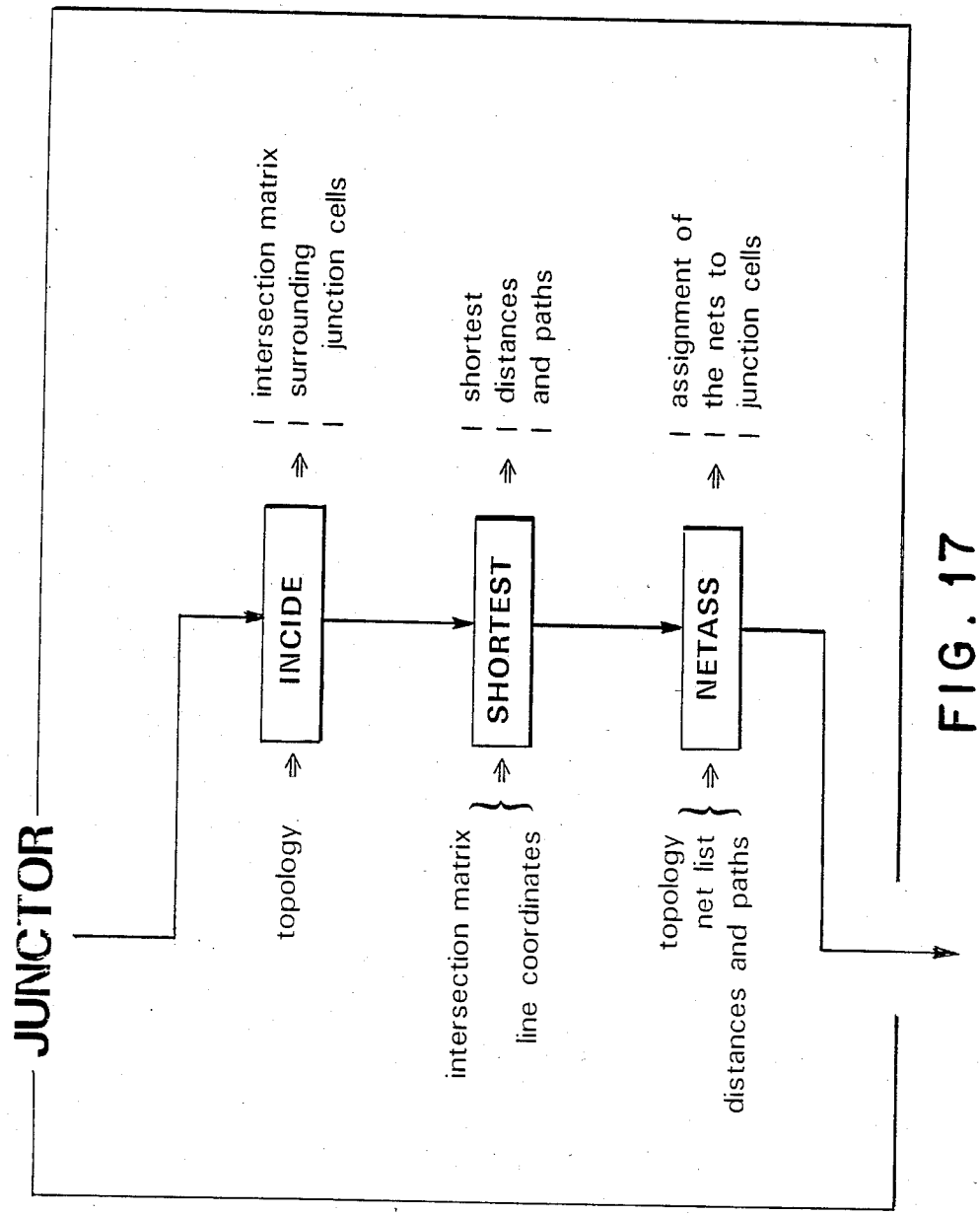
Figures 19A, 19B:
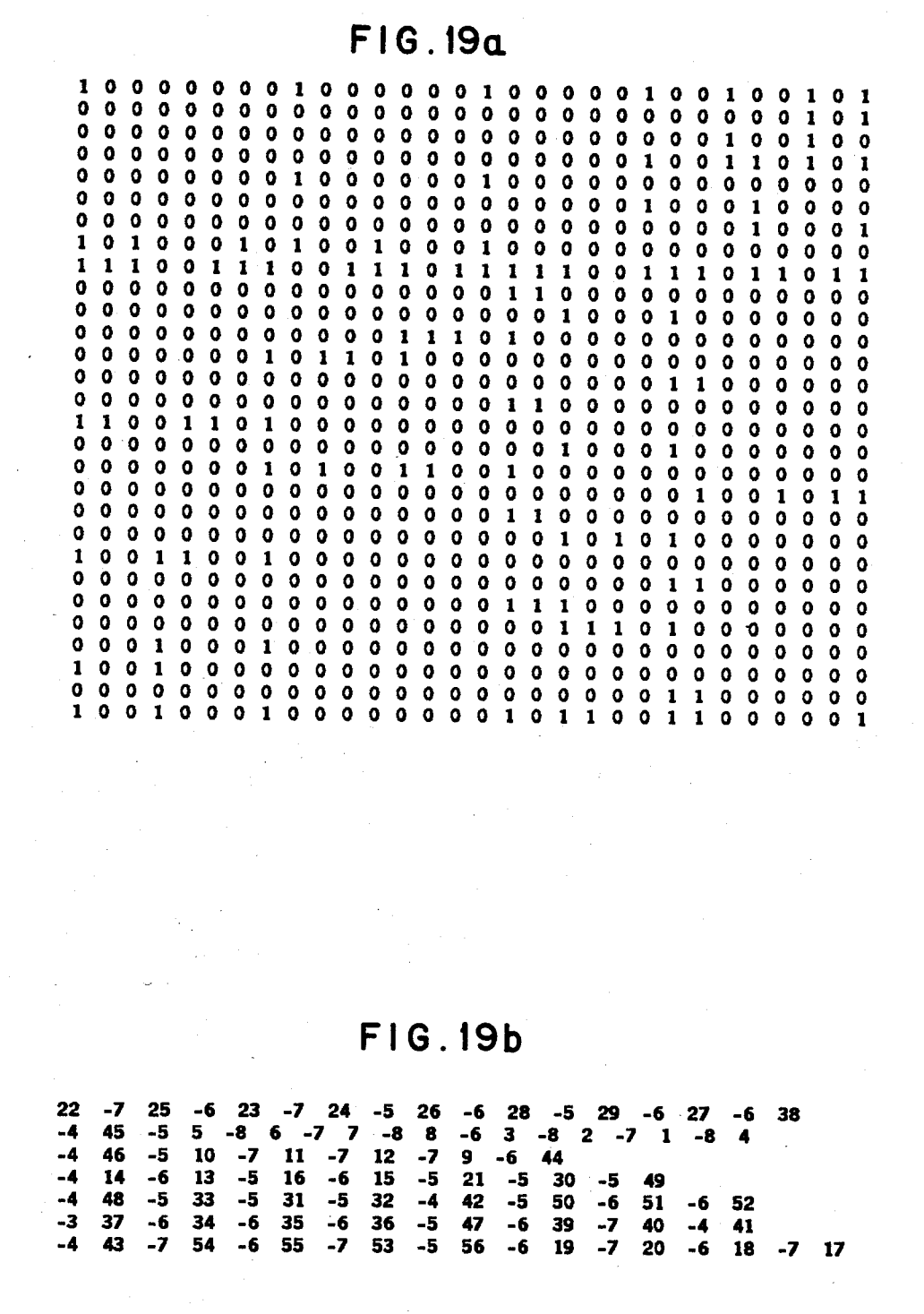
Figure 19C:
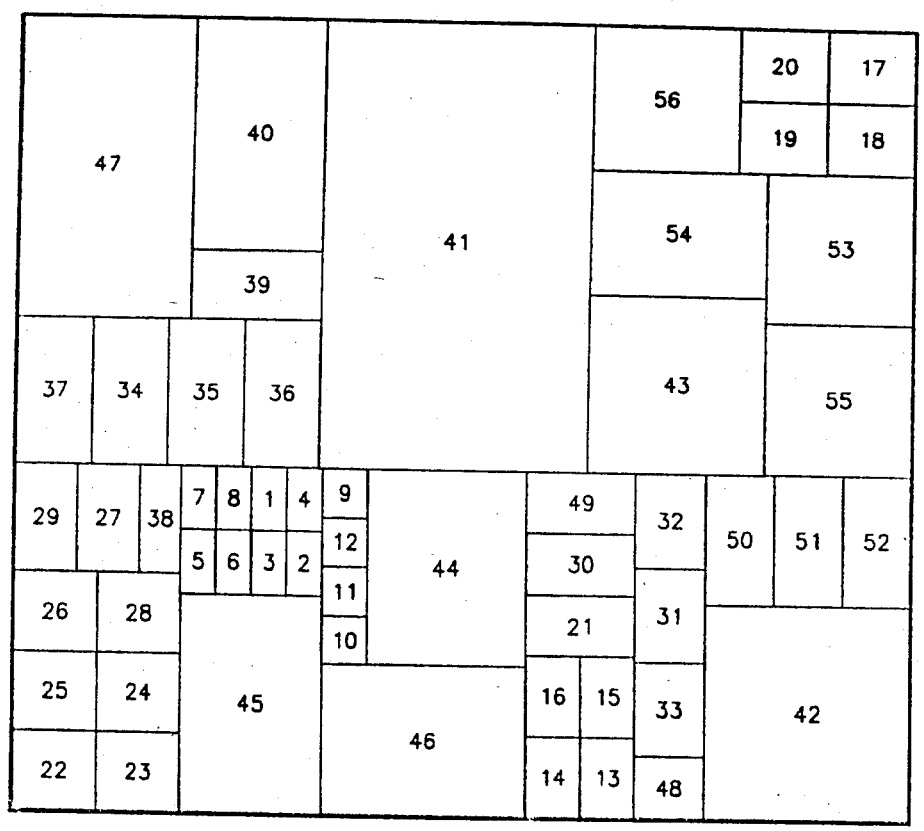
Figure 21:
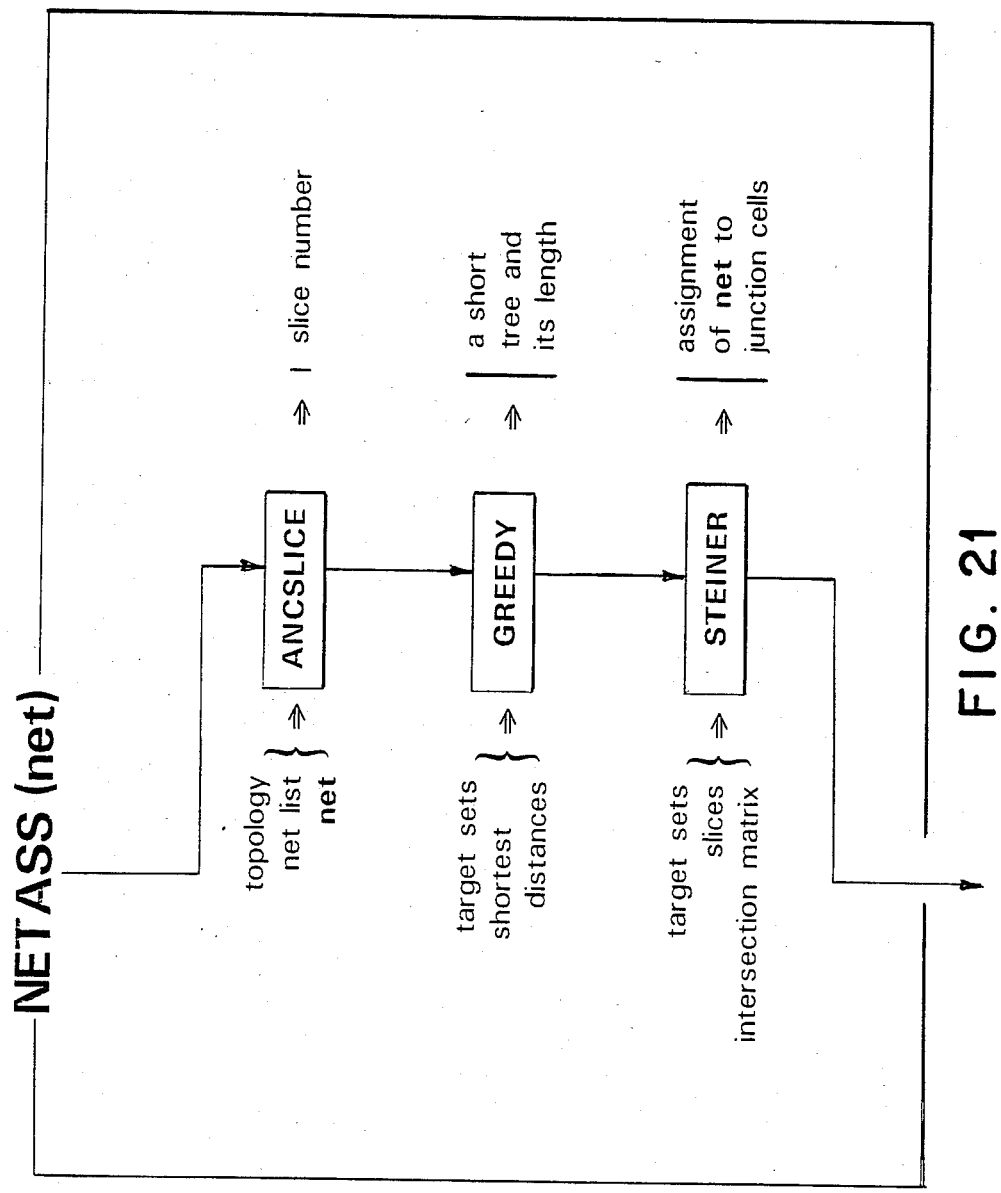
Figure 24:
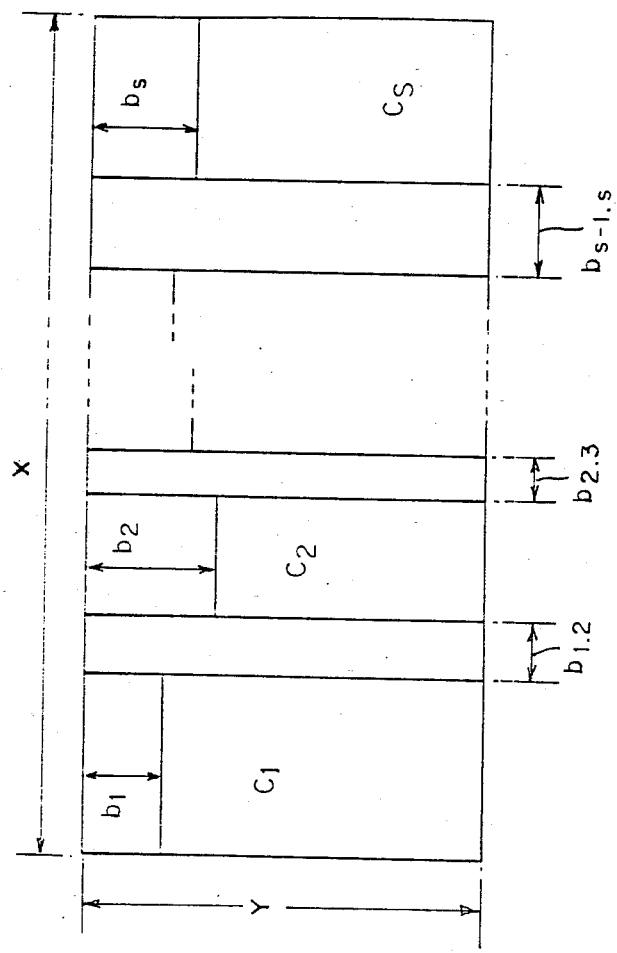
Figure 25:
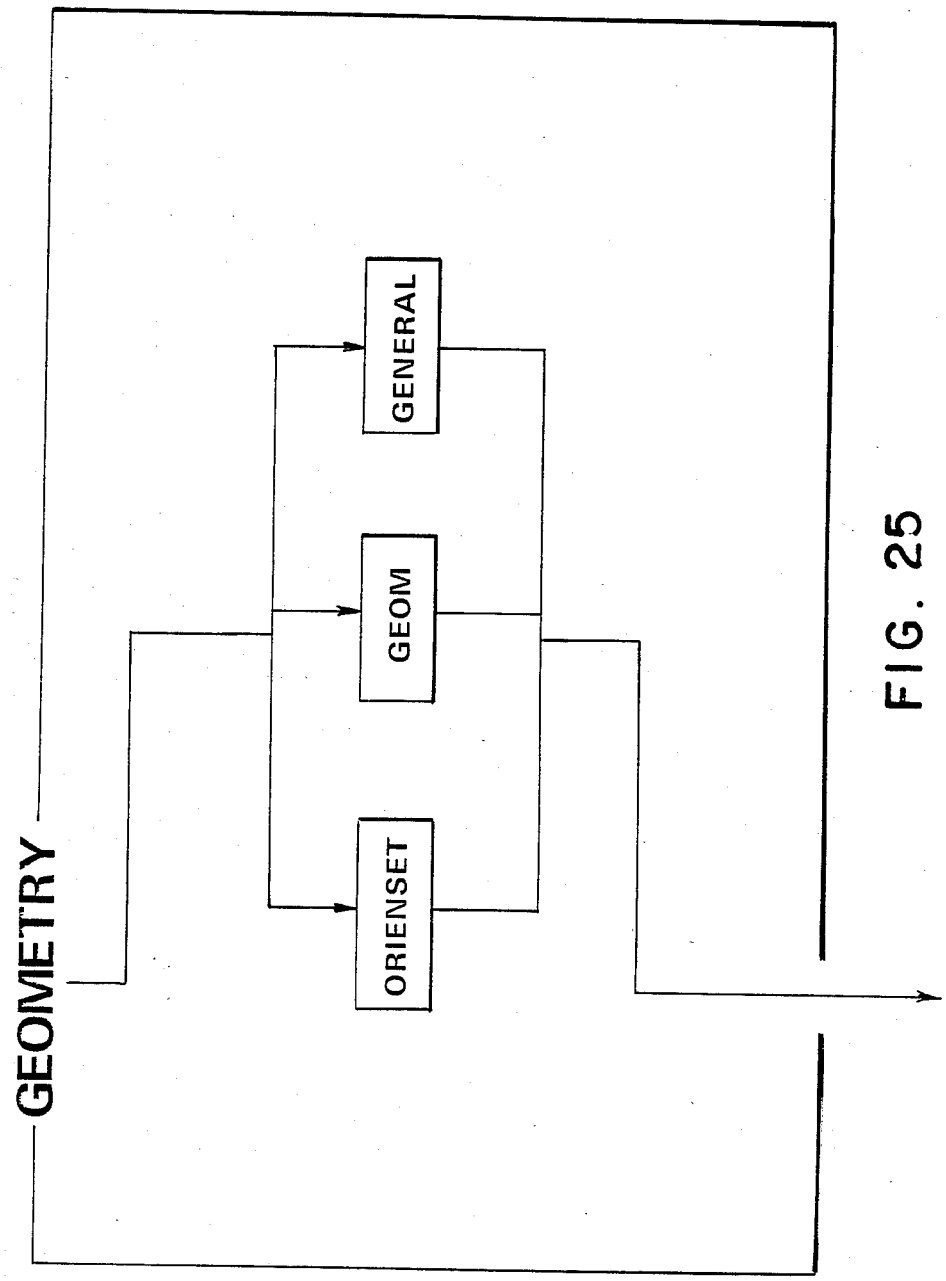
Figure 27:
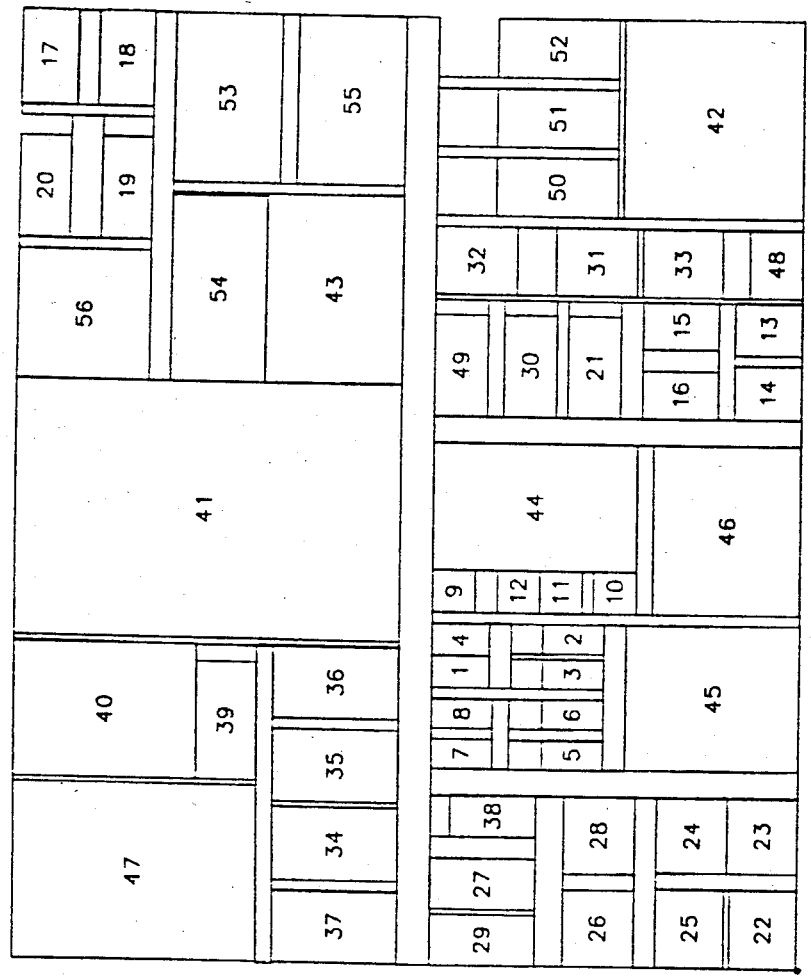
FIGS. 27 and 28 give an example of a final result of the embodiment. The emphasized line in FIG. 28 indicates the junction cell segments to which one of the nets has been assigned by JUNCTOR.
Figure 28:
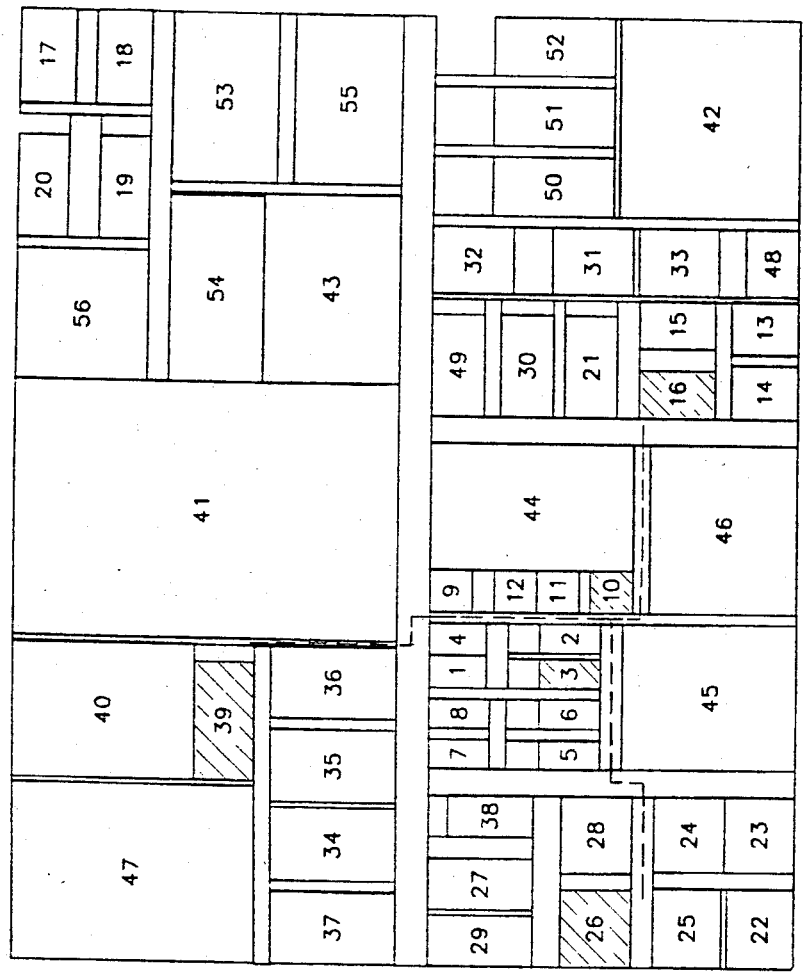

The interrelations between the procedures of JUNCTOR are in the flow diagram of FIG. 17. INCIDE, FIG. 18, fills the columns 7 up to 10 FLPL (FIG. 15b) for the rows associated with the modules and the compound slices, and the columns 7 and 8 for the junction cells. It also fills a matrix which has rows representing one set of iso-oriented junction cells, and columns to represent the other set of iso-oriented junction cells. The non-zeros in the matrix represent intersections of corresponding junction cells. An example of such a matrix is shown in FIG. 19a. Here the rows and columns are ordered according to the coordinates of the junction cells in the configuration of FIG. 19c, calculated for the shorthand tree of FIG. 19b under the assumption of zero latitudinal dimension for the junction cells.

Two functions used by the functions of FIG. 18, and elsewhere are PACK and UNPACK, given in FIG. 20.

The actual task of JUNCTOR is to assign nets to sets of junction cells. In this embodiment a method of doing this is described, where the expected total net length is as small as possible. The problem can be formulated as a Steiner tree problem on a graph, a problem well known in literature. The graph has as nodes the intersections of the junction cell. The edges represent the pair of intersections that can be reached over a junction cell without passing another intersection. The length of each edge is the distance (again under zero width assumption for the junction cells) between the two associated intersections.

In the traditional formulation of the Steiner problem the task is to find a minimum length subtree of the graph that contains all the nodes of a given subset. The nodes in this subset are called targets. There is, however, one difference with the traditional formulation of the Steiner problem. Instead of a set of targets there is set of target sets, and a minimum length tree is required that connects each given target set to at least one node. A target set consists, for example, of all nodes representing an intersection of junction cells at the periphery of a module that has to have a pin on the actual net. Or, if the side of the module on which the pin is to occur, is known, the junction cell intersections on that side induce a target set for the net at hand. In case the net is global, i.e. having connections outside the configuration, the node of the junction cell intersection closest to its entry point forms a target set. If the entry point is not known all or some of the junction cell intersections may be used for forming a target set.

An efficient solution to the general Steiner tree problem is not known. Therefore, there has been much interest in approximation algorithms with performance guarantees. For example, generating the minimum spanning tree has a fast algorithm, yielding a tree less than fifty percent longer than the Steiner tree. A slightly slower algorithm allowing for so called Steiner points, guarantees a tree length less than $2\times(1-1/k)$ the optimum. However, the slicing restraint offers several speed-ups for an algorithm searching for the optimum tree. For example, only the smallest slice containing all modules to be connected by the actual net has to be considered. Therefore, this slice is searched for by the function ANCSLICE (FIG. 23a) and is stored at the proper entry in NETL (column 6). An upper bound for the length of the optimum tree can be found in relatively short time by constructing a small spanning tree. The length of that tree is certainly not shorter than the Steiner tree. That length and the corresponding tree are returned by the procedure GREEDY of FIG. 23b.

STEINER, as outlined in FIG. 23c, is a recursive program that returns the optimum tree for a given set of target sets and for a given set of consecutive sibling slices. If there are only two target sets the problem is reduced to finding the shortest path between one node from the first and one node from the second set. Therefore, the lengths of the shortest paths between each pair of nodes and their first intermediate nodes are determined by the function of FIG. 22, SHORTEST, before calling GREEDY and STEINER for each net. If the given set of consecutive siblings contains only one slice then STEINER is called for the same set of target sets and the smallest set of consecutive child slices that contains all targets in the target sets. If the set of consecutive siblings has more than one slice, then the junction cell intersections of the junction cell between the first sibling and the second sibling in that set are determined. For each such intersection STEINER is called twice. First for the first sibling and the target sets contained in that slice extended with a one-element target set consisting of that intersection. If this one-element set is contained in one of the target sets in that slice the latter target set is removed. Then STEINER is called for the group of other siblings and the set of target sets in that group are also extended by the one-element target set of the actual intersection, and its eventual supersets are removed. The sequence of recursive STEINER-calls is stopped as soon as it is clear that it cannot lead to an optimum tree.

Figure 4D:
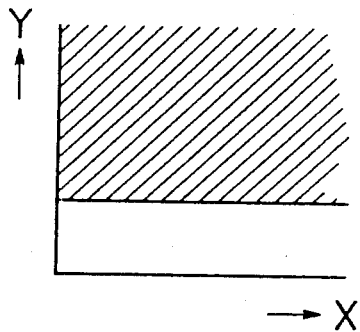

After JUNCTOR it is known which nets occur in which junction cells, and a fairly accurate estimate of the latitudinal dimension of the junction cells can be made. To realize this dimension for its junction cells, the estimate is translated into a shape constraint like the one in FIG. 4d. Since the shape constraints of the modules are supposed to be contained in the input data, all slices represented by leaves in the structure tree have shape constraints.

If all shape-constraints are convex, linear programming and related techniques can be used to find a near-optimum geometrical configuration. For each compound slice a set of linear equations can be written (FIG. 24):

$$X - y_1 - y_2 \ldots - y_s = \sum_{i=1}^{s-1} b_{i,i+1} \qquad (13)$$
$$-x_1 \qquad\qquad +Y = b_1$$
$$-x_2 \qquad\qquad +Y = b_2$$
$$\ldots \qquad\qquad \ldots$$
$$\ldots \qquad\qquad \ldots$$
$$-x_s + Y = b_s$$

Each vertex gives rise to as many equations as its degree in the tree. The inner vertices, representing the compound slices, lead to the linear equations of (13). The constraints for the junction cells are incorporated in these equations. For each leaf, representing a module, a piece-wise linear approximation of its shape constraint, enters the set. Together these equations and inequalities are the constraints the final geometrical structure has to satisfy. To find a solution that is optimal in some sense, for example the smallest total area, a suitable objective function to be optimized under these constraints, has to be defined. The dimensions resulting from the simple area distribution procedure with zero channel widths, described before, can be used as a starting point. It is the solution of the system with one extra constraint, e.g. the aspect ratio, where the compound equations have a zero right hand side. The left hand side is unchanged.

Mostly shape constraints will be convex in practice, when all inset cells have a fixed orientation. If the orientation still has to be chosen with regard to a contour score to be optimized, non-convex shape constraints will arise. The method to be described in the next paragraph can handle both cases, convex and non-convex shape constraints.

So, all leaves in the tree representing the topology of the slicing structure have a shape constraint at this stage of the process. Addition of the shape constraints of the child slices in the region in which they are all defined, yields the inverse of the shape constraint of the parent slice. In this way GEOMETRY will construct shape constraints for all slices including the common ancestor of all slices. Knowing all feasible dimension pairs for this enveloping rectangle, it selects the one that is optimal with respect to the contour score. Because each slice inherits its longitudinal dimension from its parent the other can be determined by evaluating its bounding function for the inherited value. The functions of FIG. 26 handle the most common case, where the orientation of the inset cells, and other rotation-sensitive cells have been fixed, either by specification in the input, or by using the procedures described in the TOPOLOGY part.

DGEOM must have all breakpoint information of the shape constraints of the leaves in packed form. Thus, ((,0) PACKFLPL[;1 15 16 ]) PACK BREAKPTS.

With CGEOM one out of four objective functions can be selected.

Thus, while the invention has been described with reference to a preferred embodiment thereof, it will be understood by those skilled in the art that various changes in form and details may be made without departing from the scope of the invention.

What is claimed is:

1. A method for allocating rectangular areas for given elements on a rectangular surface of a product such as an integrated circuit, each element being limited by a shape constraint and related to the other elements by proximity information, comprising the steps of:
   deriving a distance space to position a center of each said element on said product surface in a configuration of points in a plane;
   constructing a slicing structure from said point configuration of said element centers;
   determining from the result of the above steps the dimensions, position, and orientation of said elements; and
   dividing up said product surface accordingly.

2. A method according to claim 1, wherein said proximity information comprises: an interconnection count.

3. A method according to claim 1, wherein said proximity information comprises: a distance matrix.

4. A method according to claim 1, wherein said proximity information comprises: a weights matrix.

5. A method according to claim 1, wherein said proximity information comprises: a wiring net list.

6. A method according to claim 5, wherein individual weights are assigned to the nets in said wiring net list.

7. A method according to claim 1, wherein said proximity information comprises: an incidence structure over said elements and interrelations.

8. A method according to claim 7, wherein individual weights are assigned to the interrelations of said incidence structure.

9. A method according to claim 1, wherein said proximity information leads to a configuration of points in the plane, where the points represent said elements.

10. A method according to claim 1, wherein said proximity information is a point configuration in the plane.

11. A method according to claim 1, wherein said construction of the slicing structure from the configuration of element centers is based on shrink factors for lines dividing a set of rectangles into disjunct subsets of rectangles without changing their relative position in the perpendicular direction.

12. A method according to claim 1, wherein said construction of the slicing structure from the configuration of element centers is based on the deformation the elements will incur if a set of lines is accepted as the next set of slicing lines.

13. A method according to claim 1, wherein said construction of the slicing structure from the configuration of element centers is based on the distribution of area over the ensuing slices after accepting a set of lines as the next set of slicing lines.

14. A method according to claim 1, wherein said construction of the slicing structure is based on determining the geometry of the partial slicing structure with all elements considered to be flexible and all interspaces assumed to be zero.

15. A method according to claim 1, wherein said construction of the slicing structure is based on a combination of at least two of the following indicators: shrink factors, deformation, area distribution, and geometrical top-down calculations under the assumption of only flexible elements and no interspaces.

16. A method according to claim 1, comprising the further step of:
   determining the distances required between elements for the realization of the interrelations among the elements.

17. A method according to claim 24 wherein said distances needed for realizing the interrelations among the elements are assumed to be located between consecutive sibling slices, in junction cells.

18. A method according to claim 17, wherein said determining of the distances needed for realizing the interrelations consists of assessing the latitudinal dimensions of the junction cells.

19. A method according to claim 18, wherein said assessing of the latitudinal dimensions of the junction cells is based on the assignment of nets to the junction cell segments between consecutive junction cell intersections.

20. A method according to claim 19, wherein said assignment of the nets to the junction cell segments between consecutive junction cell intersections is based on solving the Steiner problem on the junction cell intersection structure, using the slicing properties for reducing the computational complexity.

21. A method according to claim 1, wherein said shape constraints are convex piece-wise linear bounding functions, and said determining of dimensions, and position of said elements is performed using linear programming with a linear objective function of slice dimensions.

22. A method according to claim 1, wherein said shape constraints are monotonously non-increasing piece-wise linear bounding functions, and said calculation of dimensions, position, and orientation is performed by minimizing at least one of area, perimeter, and any other quasi-concave objective function of the dimensions of the enveloping rectangle, which is monotone in both its arguments.

23. A method according to claim 1, wherein said surface is a mask for circuit integration.

24. A method according to claim 1, comprising the further steps of:
   selecting a pin distribution over the sides of at least a portion of said elements; and determining said orientation of said elements using said pin distribution and said configuration of said element centers.

* * * * *